(12) United States Patent
Facusse et al.

(10) Patent No.: US 9,351,424 B2
(45) Date of Patent: May 24, 2016

(54) PASSIVE COOLING ENCLOSURE SYSTEM AND METHOD FOR ELECTRONICS DEVICES

(71) Applicant: Xyber Technologies, Miami, FL (US)

(72) Inventors: Mario E. Facusse, Miami, FL (US); David Scott Kosch, Austin, TX (US)

(73) Assignee: XYBER TECHNOLOGIES, Miami, FL (US)

( * ) Notice: Subject to any disclaimer, the term of this patent is extended or adjusted under 35 U.S.C. 154(b) by 285 days.

(21) Appl. No.: 14/049,529

(22) Filed: Oct. 9, 2013

(65) Prior Publication Data

US 2014/0036450 A1    Feb. 6, 2014

Related U.S. Application Data

(63) Continuation of application No. 12/716,888, filed on Mar. 3, 2010, now Pat. No. 8,582,298, which is a continuation-in-part of application No. 12/488,818, filed on Jun. 22, 2009, now Pat. No. 9,036,351.

(51) Int. Cl.
*H05K 7/20* (2006.01)
*H01L 23/473* (2006.01)

(52) U.S. Cl.
CPC ........ *H05K 7/20418* (2013.01); *H05K 7/20809* (2013.01); *H05K 7/20818* (2013.01); *H05K 7/20827* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ....... 361/676–678, 679.46–679.54, 361/688–723; 165/80.1–80.5, 104.33, 185; 174/15.1–15.3, 16.1–16.3, 547, 548; 257/712–722, E23.088; 24/453, 24/458–459; 454/184; 312/236
See application file for complete search history.

(56) References Cited

U.S. PATENT DOCUMENTS

| | | |
|---|---|---|
| 3,904,933 A | 9/1975 | Davis |
| 4,111,328 A | 9/1978 | Eggert et al. |
| 4,449,576 A | 5/1984 | Baum et al. |
| 4,771,365 A | 9/1988 | Cichocki et al. |
| 4,777,561 A | 10/1988 | Murphy et al. |
| 5,177,666 A | 1/1993 | Bland et al. |
| 5,339,214 A | 8/1994 | Nelson |
| 5,343,358 A | 8/1994 | Hilbrink |
| 5,549,155 A | 8/1996 | Meyer, IV et al. |
| 5,801,924 A | 9/1998 | Salmonson |
| 5,822,187 A | 10/1998 | Garner et al. |
| 5,826,645 A | 10/1998 | Meyer, IV et al. |
| 5,926,369 A | 7/1999 | Ingraham et al. |
| 5,926,372 A * | 7/1999 | Rinehart ................. H01L 22/20 257/706 |
| 5,946,191 A | 8/1999 | Oyamada |
| 6,021,044 A | 2/2000 | Neville et al. |

(Continued)

FOREIGN PATENT DOCUMENTS

| | | |
|---|---|---|
| CN | 1440075 A | 9/2003 |
| JP | 56-094698 A | 7/1981 |

(Continued)

OTHER PUBLICATIONS

Decision of Rejection received in Japanese Patent Application No. 2012-517515 issued Jan. 6, 2015 (received Feb. 19, 2015), 4 pages—with English Translation.

(Continued)

*Primary Examiner* — Anthony Haughton
*Assistant Examiner* — Razmeen Gafur
(74) *Attorney, Agent, or Firm* — Foley & Lardner LLP

(57) ABSTRACT

An apparatus for passively cooling electronics. The apparatus for passively cooling electronics includes at least one heat sink configured to be thermally coupled to at least one cabinet. When the at least one cabinet is thermally coupled to the at least one heat sink, the at least one heat sink draws heat from the at least one cabinet.

20 Claims, 19 Drawing Sheets

(56) References Cited

U.S. PATENT DOCUMENTS

| | | | |
|---|---|---|---|
| 6,141,216 A | 10/2000 | Holung et al. | |
| 6,186,889 B1 | 2/2001 | Byrne | |
| 6,189,213 B1 | 2/2001 | Kimura et al. | |
| 6,313,990 B1 | 11/2001 | Cheon | |
| 6,360,813 B1 | 3/2002 | Katoh et al. | |
| 6,373,696 B1 | 4/2002 | Bolognia et al. | |
| 6,542,364 B2 | 4/2003 | Lai et al. | |
| 6,549,414 B1 | 4/2003 | Tokuhara et al. | |
| 6,674,643 B2 | 1/2004 | Centola et al. | |
| 6,708,754 B2 | 3/2004 | Wei | |
| 6,796,372 B2 * | 9/2004 | Bear | F28F 13/00 165/104.21 |
| 6,833,991 B2 | 12/2004 | Van Gaal | |
| 6,839,232 B2 | 1/2005 | Elo et al. | |
| 7,012,807 B2 | 3/2006 | Chu et al. | |
| 7,012,815 B2 | 3/2006 | Garnett et al. | |
| 7,085,136 B2 | 8/2006 | Lin | |
| 7,096,928 B2 | 8/2006 | Phillips et al. | |
| 7,133,283 B2 | 11/2006 | Faneuf et al. | |
| 7,133,284 B2 | 11/2006 | Lee | |
| 7,136,286 B2 | 11/2006 | Chuang | |
| 7,209,348 B2 | 4/2007 | Yazawa | |
| 7,209,353 B2 | 4/2007 | Ammirata | |
| 7,233,491 B2 | 6/2007 | Faneuf et al. | |
| 7,303,947 B1 * | 12/2007 | Bronecke | H01L 23/3677 257/E21.508 |
| 7,319,588 B2 | 1/2008 | Peng et al. | |
| 7,345,877 B2 | 3/2008 | Asfia et al. | |
| 7,353,859 B2 * | 4/2008 | Stevanovic | H01L 23/473 165/170 |
| 7,365,987 B2 * | 4/2008 | Jeong | H05K 5/02 361/719 |
| 7,403,384 B2 | 7/2008 | Pflueger | |
| 7,447,017 B2 | 11/2008 | Koo | |
| 7,457,118 B1 | 11/2008 | French et al. | |
| 7,480,140 B2 | 1/2009 | Hara et al. | |
| 7,508,669 B2 | 3/2009 | Fonfara et al. | |
| 7,626,820 B1 | 12/2009 | Konshak et al. | |
| 7,907,409 B2 | 3/2011 | Wyatt et al. | |
| 8,243,451 B2 * | 8/2012 | Dede | F28F 3/046 165/104.33 |
| 2002/0008961 A1 | 1/2002 | Amaike et al. | |
| 2003/0000721 A1 | 1/2003 | Garner | |
| 2003/0010477 A1 | 1/2003 | Khrustalev et al. | |
| 2003/0024687 A1 | 2/2003 | Cheng et al. | |
| 2004/0012924 A1 | 1/2004 | Hanson et al. | |
| 2004/0182552 A1 | 9/2004 | Kubo | |
| 2004/0188080 A1 | 9/2004 | Gailus et al. | |
| 2004/0190249 A1 | 9/2004 | Hasegawa et al. | |
| 2004/0257770 A1 | 12/2004 | Hu | |
| 2005/0030719 A1 | 2/2005 | Lin et al. | |
| 2005/0083660 A1 | 4/2005 | Lee | |
| 2005/0088822 A1 | 4/2005 | Oberlin et al. | |
| 2005/0099776 A1 | 5/2005 | Xue et al. | |
| 2005/0114876 A1 | 5/2005 | Atarashi et al. | |
| 2005/0128710 A1 * | 6/2005 | Beitelmal | G06F 1/20 361/709 |
| 2005/0135063 A1 | 6/2005 | Heesen | |
| 2005/0141202 A1 | 6/2005 | Lee et al. | |
| 2005/0207121 A1 | 9/2005 | Egawa | |
| 2005/0270751 A1 | 12/2005 | Coglitore et al. | |
| 2005/0286229 A1 | 12/2005 | Ku | |
| 2005/0286230 A1 | 12/2005 | Yatskov | |
| 2006/0005980 A1 | 1/2006 | Garner | |
| 2006/0007660 A1 | 1/2006 | Yatskov et al. | |
| 2006/0044760 A1 | 3/2006 | Pal | |
| 2006/0109631 A1 | 5/2006 | Marro et al. | |
| 2006/0139880 A1 | 6/2006 | Tate | |
| 2006/0146496 A1 | 7/2006 | Asfia et al. | |
| 2006/0279926 A1 | 12/2006 | Koo | |
| 2007/0023904 A1 * | 2/2007 | Salmon | G02B 6/43 257/737 |
| 2007/0047206 A1 | 3/2007 | Lee et al. | |
| 2007/0070600 A1 | 3/2007 | Tomioka et al. | |
| 2007/0163770 A1 | 7/2007 | Liu et al. | |
| 2007/0171616 A1 | 7/2007 | Peng et al. | |
| 2007/0236885 A1 | 10/2007 | Zhao et al. | |
| 2007/0236888 A1 | 10/2007 | Eckberg et al. | |
| 2007/0242438 A1 | 10/2007 | Belits et al. | |
| 2008/0007913 A1 | 1/2008 | Sullivan et al. | |
| 2008/0007915 A1 | 1/2008 | Chen | |
| 2008/0013270 A1 | 1/2008 | Sullivan | |
| 2008/0024992 A1 * | 1/2008 | Pflueger | H05K 7/20 361/705 |
| 2008/0035311 A1 | 2/2008 | Hsu | |
| 2008/0042429 A1 | 2/2008 | Schick et al. | |
| 2008/0043442 A1 | 2/2008 | Strickland et al. | |
| 2008/0055851 A1 | 3/2008 | Hall et al. | |
| 2008/0080140 A1 * | 4/2008 | Hsieh | H01L 23/4006 361/707 |
| 2008/0087406 A1 | 4/2008 | Asfia et al. | |
| 2008/0117593 A1 | 5/2008 | Andric et al. | |
| 2008/0174955 A1 | 7/2008 | Eddy et al. | |
| 2008/0180915 A1 | 7/2008 | Lin | |
| 2008/0212289 A1 | 9/2008 | Lin | |
| 2008/0218980 A1 | 9/2008 | Tracewell et al. | |
| 2008/0259566 A1 | 10/2008 | Fried | |
| 2009/0004902 A1 | 1/2009 | Pandey et al. | |
| 2009/0009958 A1 | 1/2009 | Pflueger | |
| 2009/0009969 A1 | 1/2009 | Chu | |
| 2009/0025909 A1 | 1/2009 | Huang | |
| 2009/0032937 A1 * | 2/2009 | Mann | H01L 23/4735 257/712 |
| 2009/0040725 A1 | 2/2009 | Peng et al. | |
| 2009/0094594 A1 * | 4/2009 | Walker | H05K 7/20145 717/174 |
| 2009/0151492 A1 | 6/2009 | Chiang et al. | |
| 2009/0168345 A1 * | 7/2009 | Martini | F24F 11/0001 361/691 |
| 2009/0190303 A1 | 7/2009 | Chu et al. | |
| 2009/0211730 A1 | 8/2009 | Zhou et al. | |
| 2009/0225515 A1 | 9/2009 | Hom et al. | |
| 2010/0032141 A1 | 2/2010 | Heydari et al. | |
| 2010/0038758 A1 * | 2/2010 | Stolze | H01L 23/367 257/675 |
| 2010/0127371 A1 * | 5/2010 | Tschirbs | H01L 23/13 257/684 |
| 2010/0142155 A1 * | 6/2010 | Mertol | H01L 23/055 361/719 |
| 2010/0157531 A1 * | 6/2010 | Mason | H01Q 1/02 361/697 |
| 2010/0170714 A1 * | 7/2010 | Poidl | H05K 7/20418 174/547 |
| 2010/0175851 A1 | 7/2010 | Heydari et al. | |
| 2010/0177519 A1 * | 7/2010 | Schlitz | F04B 17/00 362/294 |
| 2010/0245179 A1 * | 9/2010 | Puzella | H01Q 1/02 343/702 |
| 2010/0290186 A1 | 11/2010 | Zeng et al. | |
| 2011/0304037 A1 * | 12/2011 | Miyamoto | H01L 23/4334 257/693 |
| 2011/0316143 A1 * | 12/2011 | Noritake | H01L 21/565 257/713 |
| 2012/0153455 A1 * | 6/2012 | Mizuno | H01L 23/473 257/712 |
| 2013/0258596 A1 * | 10/2013 | Sharaf | H05K 7/20927 361/702 |
| 2013/0294032 A1 * | 11/2013 | Stella | H01L 23/367 361/718 |

FOREIGN PATENT DOCUMENTS

| | | |
|---|---|---|
| JP | 2002-032153 | 1/2002 |
| JP | 2002-324993 | 11/2002 |
| JP | 2003-035441 | 2/2003 |
| JP | 2004-246649 | 9/2004 |
| JP | 2005-158101 | 6/2005 |
| JP | 2006-073099 | 3/2006 |

OTHER PUBLICATIONS

Office Action received in Chinese Patent Application No. 201080037116.2 issued May 19, 2015 (17 pages) with English Translation.

(56) References Cited

OTHER PUBLICATIONS

Notice of Allowance received in U.S. Appl. No. 12/488,818 mailed Jan. 22, 2015, 20 pages.
Second Office Action received in Chinese Patent Application No. 201080037116.2 issued Nov. 14, 2014, 17 pages—with English translation.
First Office Action received in China Patent Application No. 201080037116.2 issued Mar. 5, 2014 (17 pages) with English translation.
Office Action received in Japanese Patent Application No. 2012-517515 issued Apr. 1, 2014 (7 pages) with English Translation.
Final Office Action issused for U.S. Appl. No. 12/716,888 mailed May 21, 2013 (28 pages).
Final Office Action received in U.S. Appl. No. 12/488,818 mailed Jan. 28, 2011 (15 pages).
Final Office Action received in U.S. Appl. No. 12/716,888 mailed Jun. 21, 2012 (16 pages).
Final Office Action received in U.S. Appl. No. 12/716,888 mailed Oct. 14, 2011 (13 pages).
International Preliminary Report on Patentability received for PCT/US2010/030118 dated Jan. 12, 2012 (5 pages).
International Search Report and Written Opinion received for PCT/US2010/030118 mailed Oct. 20, 2010 (8 pages).
Non-final Office Action received for U.S. Appl. No. 12/716,888 dated Feb. 29, 2012 (17 pages).
Non-final Office Action received in U.S. Appl. No. 12/488,818 dated Jul. 8, 2010 (12 pages).
Non-Final Office Action received in U.S. Appl. No. 12/716,888 dated Jan. 3, 2013 (22 pages).
Non-final Office Action received in U.S. Appl. No. 12/716,888 mailed Jan. 21, 2011 (15 pages).
Notice of Allowance issued in U.S. Appl. No. 12/716,888 mailed Aug. 1, 2013 (12 pages).

\* cited by examiner

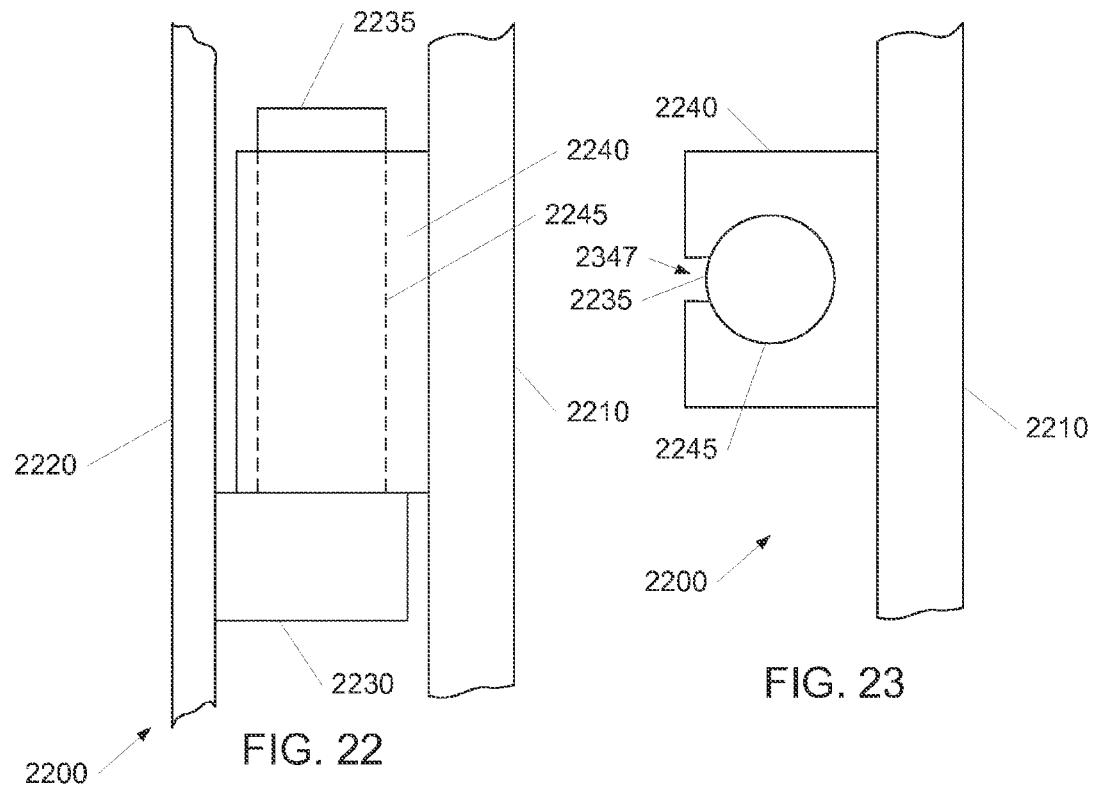
FIG. 22
FIG. 23
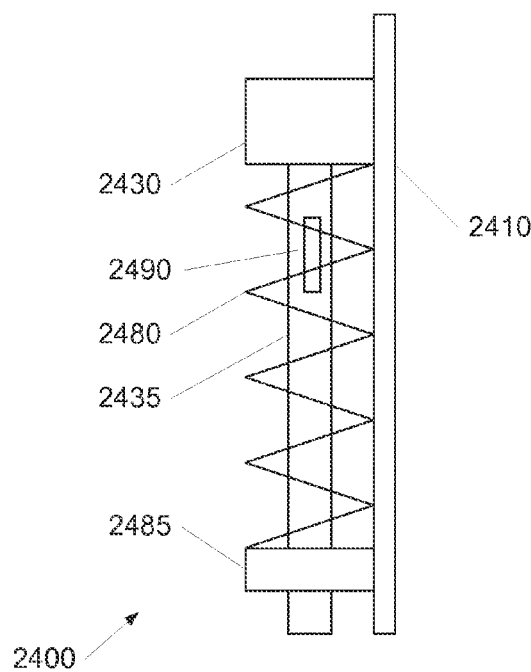
FIG. 24

PASSIVE COOLING ENCLOSURE SYSTEM AND METHOD FOR ELECTRONICS DEVICES

CROSS-REFERENCE TO RELATED PATENT APPLICATIONS

The present application is a continuation of U.S. patent application Ser. No 12/716,888, filed Mar. 3, 2010, which is a Continuation-In-Part of U.S. patent application Ser. No. 12/488,818, filed Jun. 22, 2009, the entire contents of each of which are incorporated herein by reference in their entirety.

BACKGROUND

The present disclosure relates generally to the field of passive cooling and more particularly to passive cooling of electronics devices.

Legacy electronics device cooling technologies typically use a forced air cooling method to remove heat from the electronics device. More recently, advanced cooling methods, such as water cooling and phase cooling systems, have been explored. However, there are many issues, for example with installation and maintenance that arise from the use of these systems in electronics devices.

The majority of existing systems depend on a forced air cooling method, i.e. fans. In existing systems, fans are used to cool processors and other internal components. Fans suffer from multiple deficiencies. For example, fans require significant physical space, are noisy because of high RPMs, require a significant ventilation space, produce heat as they are working to reduce heat, and consume vast amounts of power to operate. Additionally, the manufacturing process by which the majority of fans are made in some instances may use harmful industrial chemicals that could be reactivated as the temperature of a fan's blades increases thereby releasing these chemicals into exposed environments. Thus, there are high costs as well as potential health and environmental issues associated with operating fan-based systems. Often, data centers are designed for more wattage then necessary in order to account for necessary, but inefficient cooling systems. In addition, fan-based systems are prone to failure due to accumulation of dust, motor malfunction or burn-out thereby increasing operational and maintenance costs. When over-heating occurs components suffer irreversible damage, increasing cost, power consumption, and environmental impact.

Liquid cooling systems are two systems in one. Liquid cooling systems are greatly limited in their cooling capacity, depending on the configuration of the electronics device. Liquid cooling systems require heat exchangers such as a radiator. As a result, liquid cooling systems still require fans to cool the radiator and other components not attached to a heat exchanger thereby supplanting the inefficiency of a forced air cooling system with a potentially dangerous and costly liquid cooling system still reliant on fans. Liquid cooling systems require significant physical space, are complicated, are noisy because of radiator fans, require a significant ventilation space, produce heat as they are working to reduce heat, and consume vast amounts of power to operate and maintain. The end user must devote significant time and effort to set-up and maintain a liquid cooling system.

Moreover, the proximity of cooling liquid with electronics is a potential safety risk. Because components produce a lot of heat, the tubing typically used is constantly expanding and contracting causing the tubes to fail and leak cooling solution, which can result in electrical shorts and irreparable internal damage.

Phase cooling involves using a compressor system to cool electronics. Phase cooling typically only cools the CPU so fans are still needed to cool other components. The fans and compressor make a significant amount of noise, require extensive maintenance, and consume a significant amount of power. Operating a phase cooling system requires a high degree of technical proficiency.

Thus, improved cooling systems and techniques are needed.

SUMMARY

A representative embodiment relates to an apparatus for passively cooling electronics. The apparatus for passively cooling electronics includes at least one heat sink configured to be thermally coupled to at least one cabinet. When the at least one cabinet is thermally coupled to the at least one heat sink, the at least one heat sink draws heat from the at least one cabinet.

Another representative embodiment relates to an apparatus for passively cooling electronics. The apparatus for passively cooling electronics includes a cabinet configured to be thermally coupled to at least one heat sink. When the cabinet is thermally coupled to the at least one heat sink, the at least one heat sink draws heat from the cabinet.

Another representative embodiment relates to a method for passively cooling electronics. The method includes drawing heat from a cabinet through a thermal joint to at least one heat sink. The heat is dissipated in a channel. The at least one heat sink forms at least part of the channel.

BRIEF DESCRIPTION OF THE DRAWINGS

FIG. 22 is a top view of a thermal joint in accordance with a representative embodiment.

FIG. 23 is a side view of a thermal joint of FIG. 22 in accordance with a representative embodiment.

FIG. 24 is a top view of a protected heat pipe in accordance with a representative embodiment.

DETAILED DESCRIPTION

A passive cooling enclosure system and method for electronics devices are described. In the following description, for purposes of explanation, numerous specific details are set forth to provide a thorough understanding of representative embodiments of the invention. It will be evident, however, to one skilled in the art that the representative embodiments may be practiced without these specific details. The drawings are not to scale. In other instances, well-known structures and devices are shown in simplified form to facilitate description of the representative embodiments.

Figure 1:
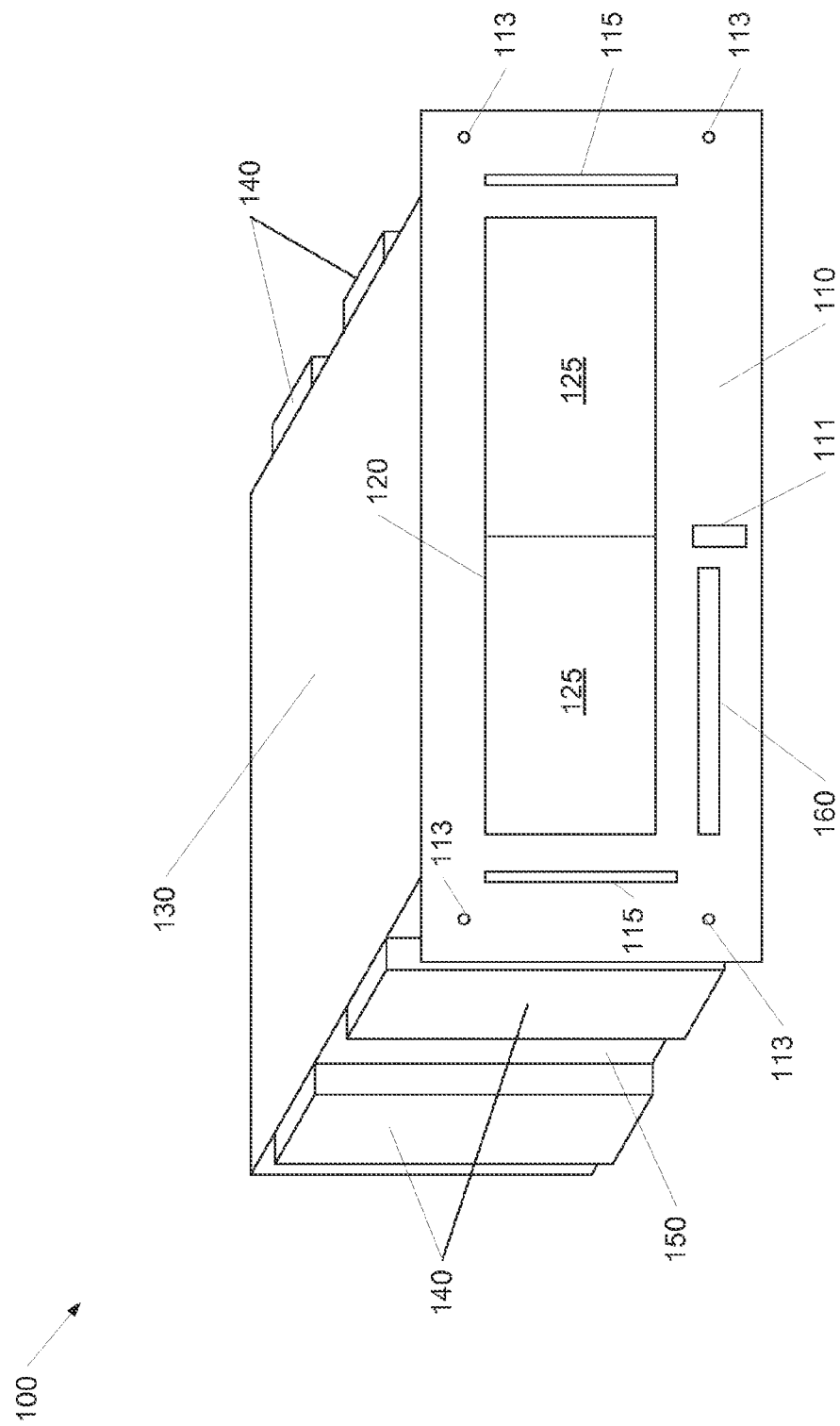
FIG. 1 is a perspective view of a passive cooling system in accordance with a representative embodiment.

Referring to FIG. 1, a perspective view of a passive cooling system 100 in accordance with a representative embodiment is shown. In an embodiment, the passive cooling system 100 is configured as a rack-mount chassis. The passive cooling system 100 includes a front panel 110, a drive bay 120, a cover 130, heat sinks 140, filler strip 150, and a media drive 160. The front panel 110 includes holes 113 for mounting the passive cooling system 100 to a rack (not shown). The rack can be a 19 inch rack, a 23 inch rack, a half rack, or any other size or depth rack. Likewise, non-rack configurations are possible. Additionally, the holes 113 can include quick connects, rails, or other fasteners. The front panel 110 also includes handles 115 for moving the passive cooling system 100 and a latch 111 for securing bay doors 125 that cover the drive bay 120. The media drive 160 can be, for example, a compact disc (CD) burner or a tape drive.

The passive cooling system 100 can be any height or depth. In particular, the drive bay 120 can be a 1 unit, 2 unit, 4 unit, 8 unit, or 16 unit bay. The bays can be configured in various configurations such as horizontal or vertical. Additionally, the passive cooling system 100 can include other input devices such as removable media drives, keyboards, displays, mice, or joysticks. Alternatively, the passive cooling system 100 can be a programmable logic controller chassis, a blade chassis, a VMEbus-type enclosure, a PCI-type enclosure, a Compact-PCI-type enclosure, a server, or any other electronic device with modular bays and/or sub-bays. The passive cooling system 100 can also be a desktop computer, a tower computer, an all-in-one system where the display is integrated, an appliance, or a mobile platform such as a laptop.

Figure 2:
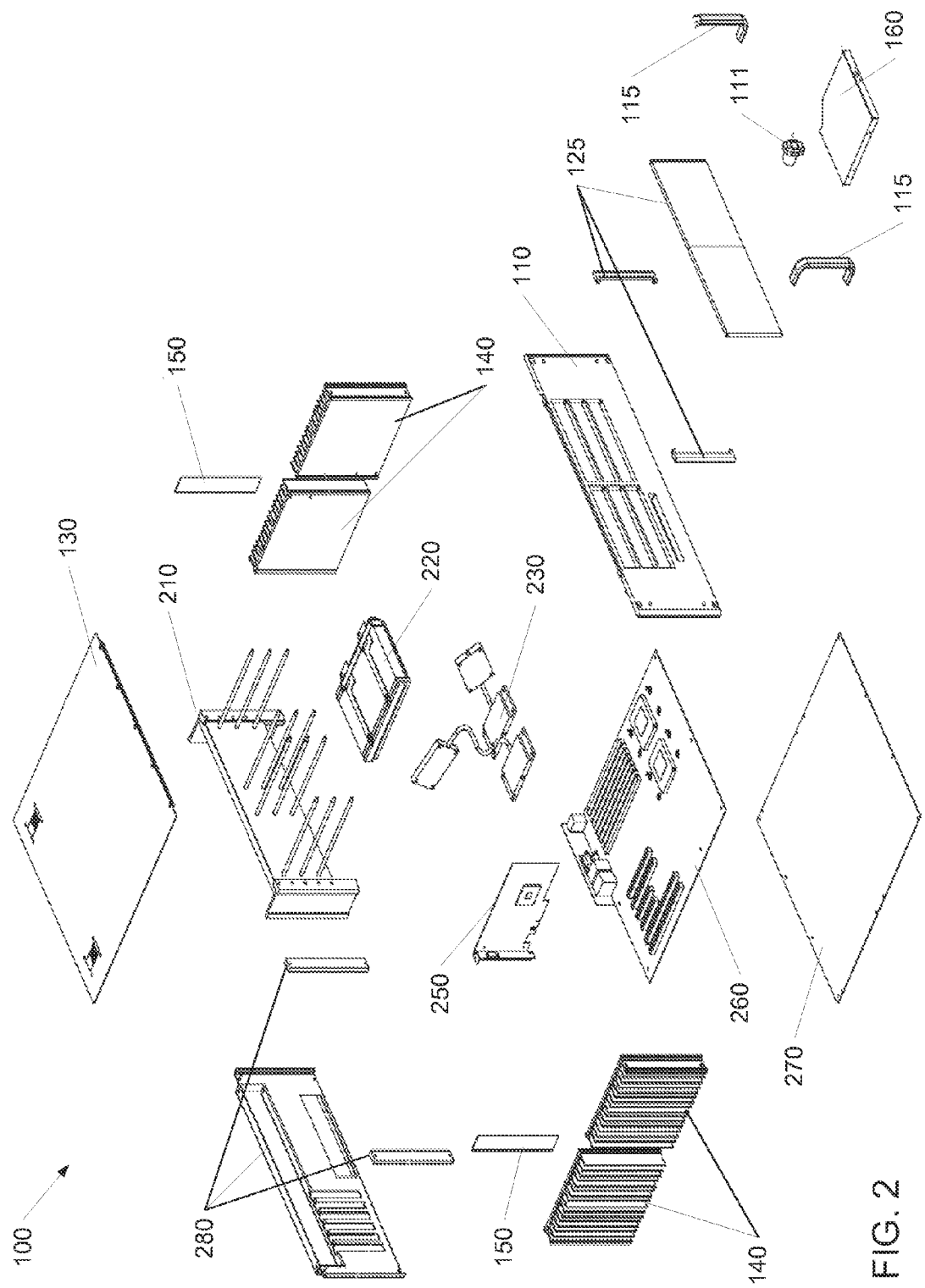
FIG. 2 is an exploded view of the passive cooling system of FIG. 1 in accordance with a representative embodiment.

Referring to FIG. 2, an exploded view of the passive cooling system 100 of FIG. 1 in accordance with a representative embodiment is shown. The passive cooling system 100 includes a front panel 110, a cover 130, heat sinks 140, filler strip 150, and a media drive 160. The front panel 110 includes handles 115 and a latch 111 for securing bay doors 125 that cover the drive bay. The passive cooling system 100 also includes a heat pipe assembly 210, a device module 220, a processor heat pipe assembly 230, a motherboard 260, a daughterboard 250, a bottom 270, and a back panel 280. The front panel 110, the cover 130, heat sinks 140, filler strip 150, the bottom 270, and the back panel 280 constitute the enclosure of the passive cooling system 100.

The device module 220 includes a cradle assembly and an electronic component. Preferably, the electronic component is a hot-swappable non-volatile storage device such as a hard drive. Alternatively, the electronic component can be any electronic device; for example, a 3.5" hard drive, a 2.5" hard drive, a 5.25" drive, an optical drive, a tape drive, solid state drive, a card reader, a memory bank, a magnetic memory bank, a communications module, a daughterboard, a sensor module, or an input/output module. The electronic component is thermally coupled to the cradle assembly. The cradle assembly draws heat away from the electronic component. The passive cooling system 100 can include a plurality of device modules. The cradle assembly can also include a clamping or securing mechanism as described in more detail below.

The device module 220 is removably mounted on the heat pipe assembly 210 via the cradle assembly. The device module 220 is thermally coupled to the heat pipe assembly 210. The heat pipe assembly 210 is thermally coupled to the heat sinks 140 and filler strip 150. The heat pipe assembly 210 draws heat from the device module 220. The heat sinks 140 draw heat from the heat pipe assembly 210. Each of the thermal couplings where two separate pieces meet can include a thermal compound to enhance the thermal characteristics of the junction. Alternatively, the heat pipe assembly 210, heat sinks 140 and filler strip 150 can be one piece that is thermally continuous. The heat pipe assembly 210 can also include electrical connections for the electronic component. The heat pipe assembly 210 is described in more detail below.

The electronic component of device module 220 is electrically connected to the motherboard 260. The motherboard 260 can also include daughterboard 250 which can be, for example, a video card, an Ethernet card, a processor card, or any other computer card. The motherboard 260 controls the device module 220 and daughterboard 250. The motherboard 260 can be powered through the rack to which the passive cooling system 100 is mounted. The motherboard 260 includes one or more processors which are thermally coupled to the heat sinks 140 by processor heat pipe assembly 230. Alternatively, other devices of the motherboard 260 and daughterboard 250, for example, a power supply, can also be thermally coupled to the heat sinks 140. Advantageously, the passive cooling system 100 provides effective cooling to the device module 220 and processors of the motherboard 260 without the use of a fan or liquid cooling system, and without the need for additional power or costly maintenance.

Figure 3:
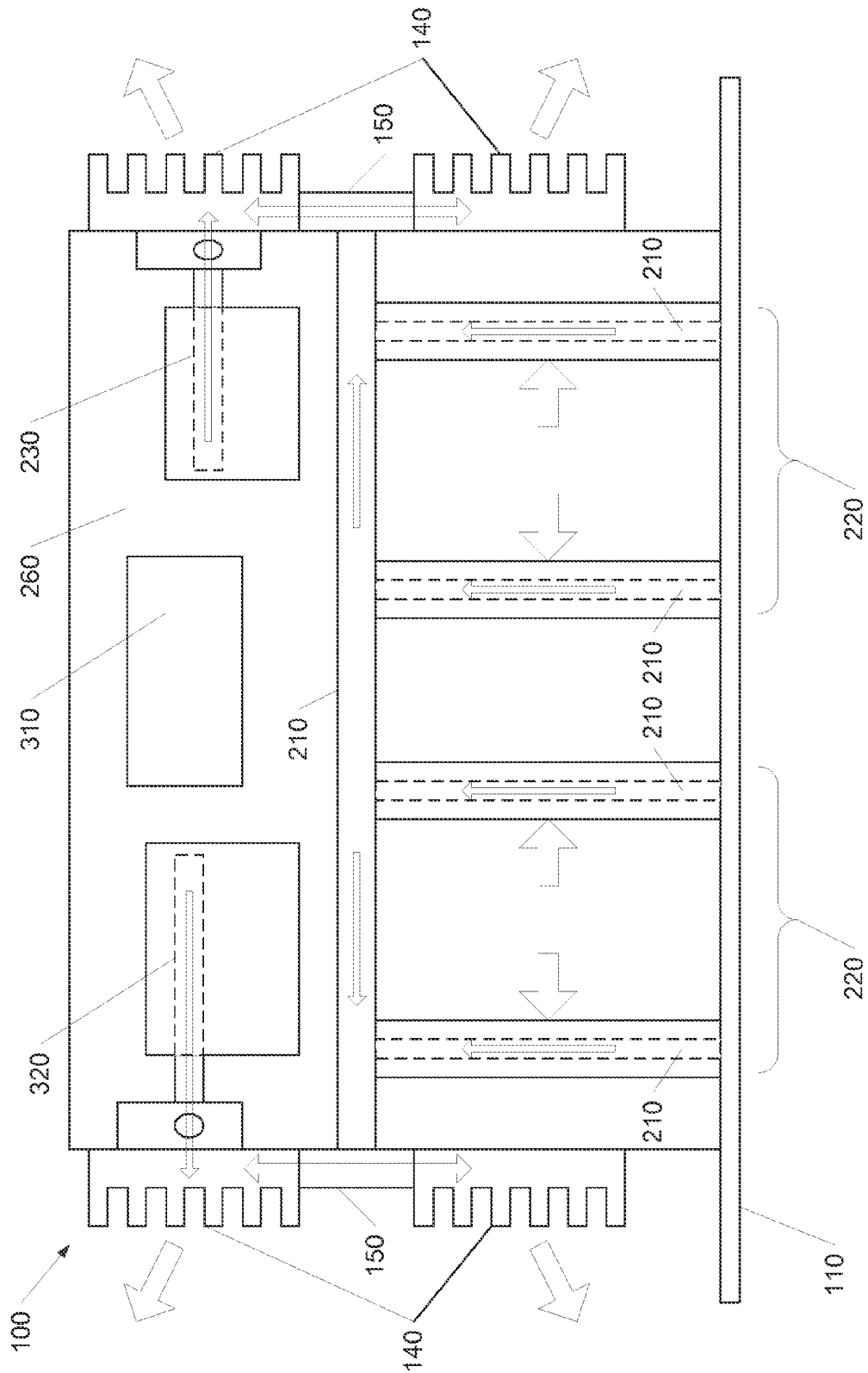
FIG. 3 is a top view of the passive cooling system of FIG. 2 in accordance with a representative embodiment.

Referring to FIG. 3, a top view of the passive cooling system 100 of FIG. 2 in accordance with a representative embodiment is shown. The block arrows depict the main thermal paths through which heat can travel. The passive cooling system 100 includes a front panel 110, heat sinks 140, filler strips 150, a heat pipe assembly 210, device modules 220, a processor heat pipe assembly 230, a motherboard 260, a memory module 310, and a power supply heat pipe assembly 320.

As device modules 220 generate heat, heat pipe assembly 210 draws heat away from the drive modules 220. The filler strips 150 draw heat away from the heat pipe assembly 210. Finally, the heat sinks 140 draw heat away from the filler strips 150 and dissipate the heat into the ambient atmosphere. Thus, the heat sinks 140, filler strips 150, heat pipe assembly 210, and device modules 220 form an open-loop cooling system.

As a processor (not shown) of the motherboard 260 generates heat, processor heat pipe assembly 230 draws heat away from the processor. The heat sinks 140 draw heat away from the processor heat pipe assembly 230. Likewise, as a power supply (not shown) of the motherboard 260 generates heat, power supply heat pipe assembly 320 draws heat away from the processor. The heat sinks 140 draw heat away from the power supply heat pipe assembly 320. In some cases, components do not need additional cooling. For example, memory module 310 can be cooled by the ambient atmosphere. Advantageously, the passive cooling system 100 provides effective cooling to the device module 220, processor and power supply without the use of a fan or liquid cooling system.

Figure 4:
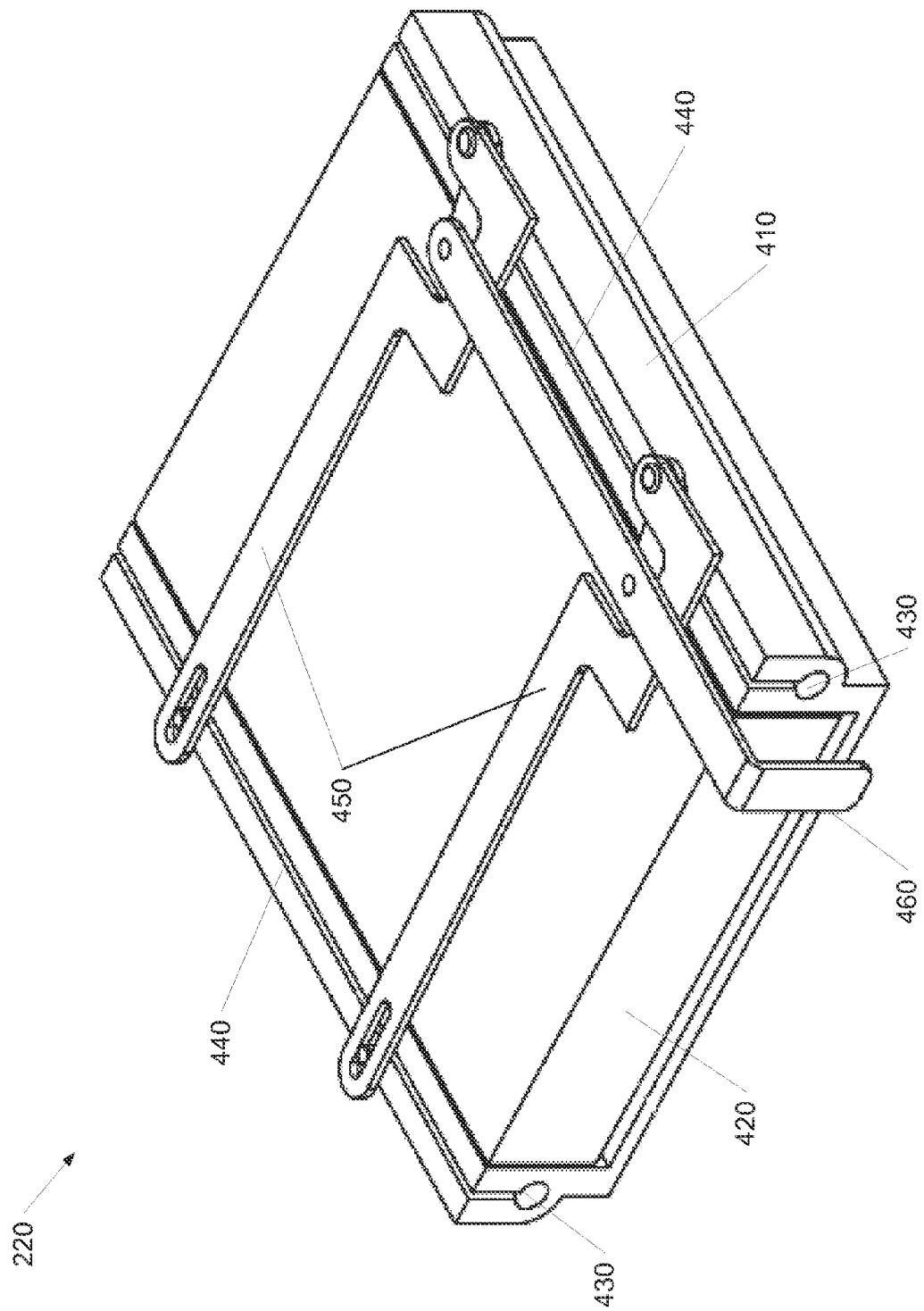
FIG. 4 is a perspective view of the device module of FIG. 2 in accordance with a representative embodiment.

Referring to FIG. 4, a perspective view of the device module 220 of FIG. 2 in accordance with a representative embodiment is shown. The device module 220 includes a cradle assembly 410 and an electronic component 420. The electronic component 420 is fastened to the cradle assembly 410. The electronic component 420 can be a non-volatile storage device, such as a hard disc drive, as described above. The cradle assembly 410 can be both a thermal sink and a docking mechanism for the electronic component 420. The cradle assembly 410 can be made of metal, or any thermally conductive material. Preferably, the cradle assembly 410 is made of aluminum or copper alloy. The cradle assembly 410 can be machined, cast, or extruded. Heat spreaders can be embedded in the cradle assembly 410. A thermal compound can be applied to the space between the electronic component 420 and the cradle assembly 410.

The cradle assembly 410 includes heat pipe conduits 430. The cradle assembly 410 is docked on heat pipes that match heat pipe conduits 430. The cradle assembly 410 can have one or a plurality of heat pipe conduits 430. The heat pipe conduits 430 are disposed on either side of the electronic component 420. Alternatively, the heat pipe conduits 430 can be located near a primary heat source of the electronic component 420. The heat pipe conduits 430 can be 1.5 inches or smaller in diameter depending on the application; however, larger conduits are also possible. For example, the heat pipe conduits 430 can range from 1.5 inches to 0.25 inches in diameter. Additionally, the heat pipe conduits 430 can each be a different size. For example, a heat conduit/heat pipe located towards the center of an enclosure can be larger than a heat conduit/heat pipe located towards the outside of the enclosure. The heat pipe conduits 430 include clamping slots 440 which can be used to change the size of the heat pipe conduits 430.

The clamping slots 440 are associated with a clamping mechanism 450. When a clamping lever 460 is pressed in, the clamping mechanism 450 closes the clamping slots 440 thereby tightening the heat pipe conduits 430. The clamping action creates a better thermal coupling between the cradle assembly 410 and its associated heat pipes. Additionally, the clamping action fastens the cradle assembly 410 to the heat pipes so that the cradle assembly 410 cannot move and maintain thermal continuity. Thus, the cradle assembly 410 can be quickly removed and replaced. Alternatively, many other clamping and/or attachment mechanisms are possible.

Figure 5A:
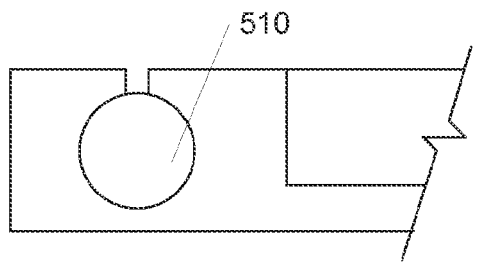
FIG. 5A-5F are diagrams of representative heat pipe topologies in accordance with a representative embodiment.
Figure 5B:
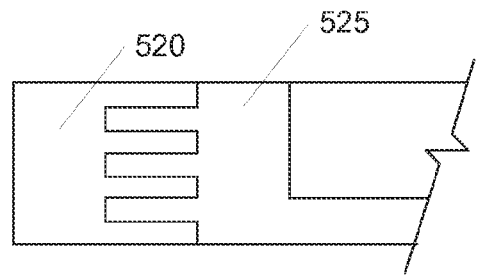
Figure 5C:
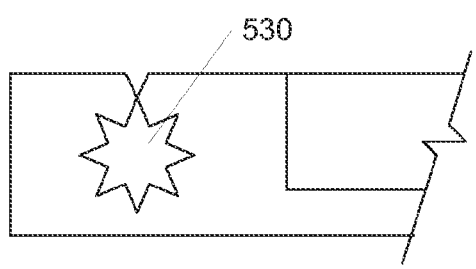
Figure 5D:
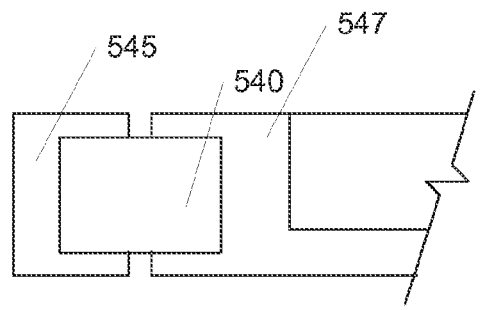
Figure 5E:
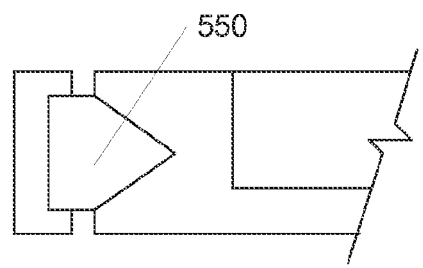
Figure 5F:
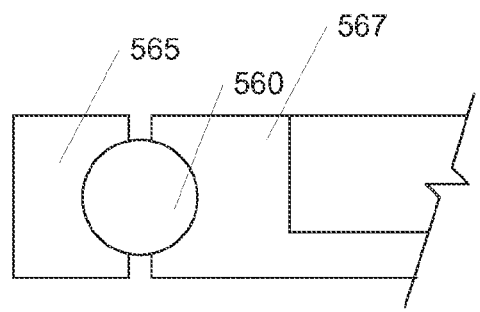

Referring to FIG. 5A-5F, diagrams of representative heat pipe topologies in accordance with a representative embodiment are shown. As shown in FIG. 5A, a heat pipe 510 can be circular. As shown in FIG. 5B, a heat pipe 520 can have fingers that press into the side of cradle assembly 525. As shown in FIG. 5C, a heat pipe 530 can have fins to increase surface area. As shown in FIG. 5D, a heat pipe 540 can be square and be pressed between cradle assembly 547 and a separate batten 545. As shown in FIG. 5E, a heat pipe 550 can be triangular. As shown in FIG. 5F, a heat pipe 560 can be circular and be pressed between cradle assembly 567 and a separate batten 565.

Figure 6:
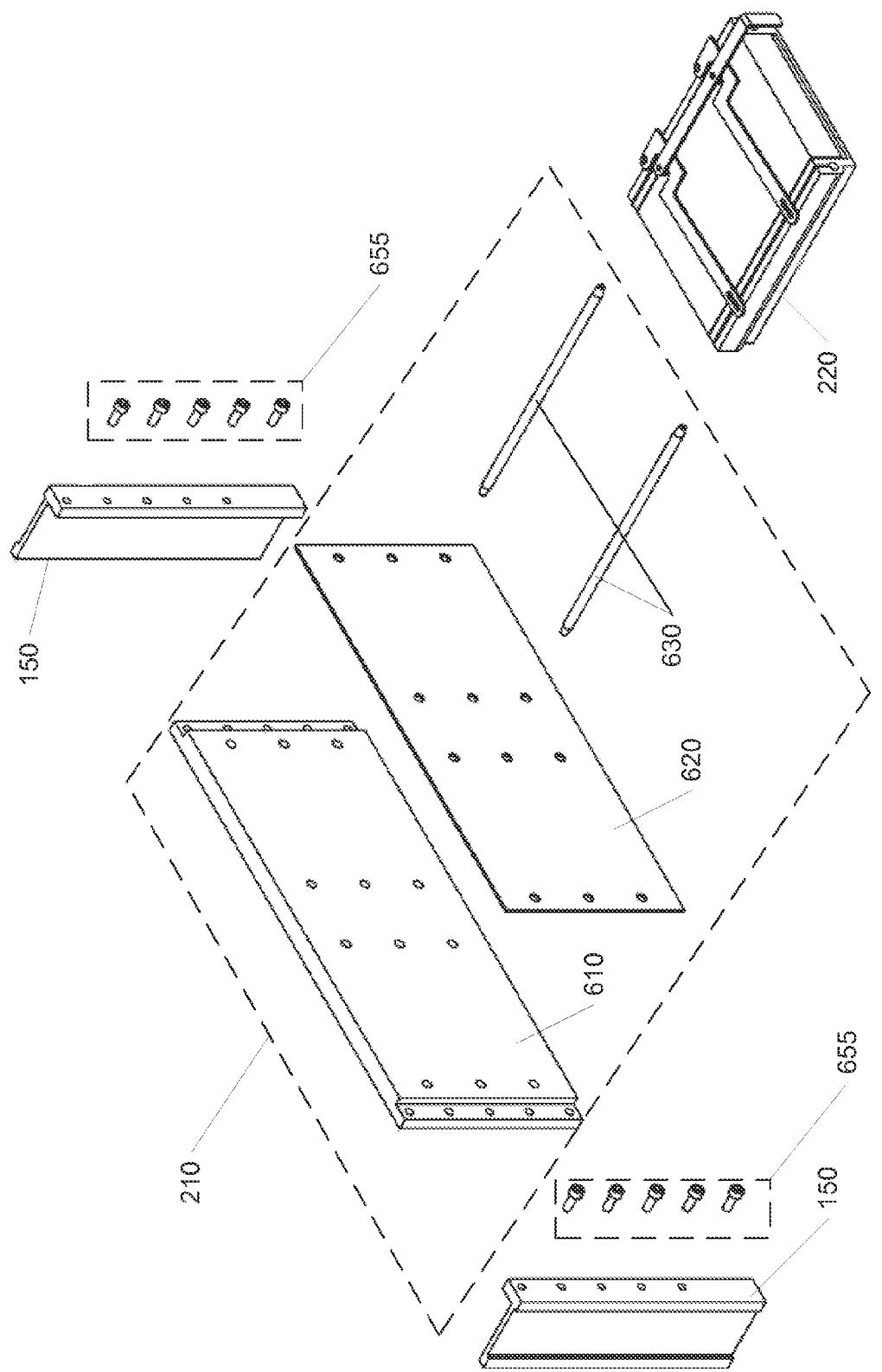
FIG. 6 is an exploded view of the heat pipe assembly of FIG. 2 in accordance with a representative embodiment.

Referring to FIG. 6, an exploded view of the heat pipe assembly 210 of FIG. 2 in accordance with a representative embodiment is shown. The heat pipe assembly 210 includes a bridge plate 610, a back plane printed circuit board (PCB) 620, and heat pipes 630. The heat pipes 630 are coupled to the bridge plate 610 through the back plane PCB 620. The bridge plate 610 is coupled to filler strips 150 by screws 655. A thermal compound can be applied to the space between the bridge plate 610 and the filler strips 150.

The bridge plate 610 can be both a thermal sink and a dock for device module 220. The bridge plate 610 can be made of metal or any thermally conductive material. In some implementations, the bridge plate 610 is made of an aluminum or copper alloy. The bridge plate 610 can be machined, cast, stamped or extruded. Heat spreaders can be embedded in the bridge plate 610. The bridge plate 610 includes a series of tap holes for heat pipes 630. Alternatively, the heat pipes 630 can be fastened to the bridge plate 610 by pressing or other fastening means that provide a good thermal connection. A thermal compound can be applied to the space between the bridge plate 610 and the heat pipes 630.

The device module 220 slides over a pair of heat pipes 630. The heat pipes 630 are tapered at one end to make sliding the device module 220 onto the heat pipes 630 easy. The heat pipes 630 can range from 1.5 inches or less in diameter depending on the application. The heat pipes 630 are arranged so that when a device module is mounted, the heat pipes 630 are disposed on either side of the device module. Alternatively, the heat pipes 630 can be arranged in various configurations around a device module such as on the top and bottom. The heat pipes 630 can be made of metal or any thermally conductive material. Preferably, the heat pipes 630 are made of thermally conductive material, such as copper alloy or aluminum. The heat pipes 630 can also be plated to prevent oxidation. The heat pipes 630 can be machined, cast, stamped or extruded. In use, a thermal compound can be applied to the surface of the heat pipes 630 to promote thermal conductivity to an associated device module 220 and to reduce oxidation. When the clamping mechanism of the device module 220 is set, the cradle assembly of the device module 220 presses against the associated heat pipes 630 creating a thermal and physical connection.

The back plane PCB 620 includes the power and data connections for the device module 220. The back plane PCB 620 is connected to the motherboard of the electronics device. Thus, the device module 220 can be easily electrically connected to the motherboard. The back plane PCB 620 is a custom PCB designed to fit around the heat pipes 630. The back plane PCB 620 includes connections appropriate for the particular kind of electronic component associated with the device module 220. For example, where the device module 220 is mounted with a hard disk, the back plane PCB 620 includes power and serial ATA, EIDE, IDE, or SCSI connectors. Thus, when a user inserts device module into a bay, the device module engages a power connector and a data connector. When the user engages the clamping mechanism, the device module becomes locked in place. The clamping mechanism can be designed to actively engage the connectors on the back plane PCB 620.

Figure 7:
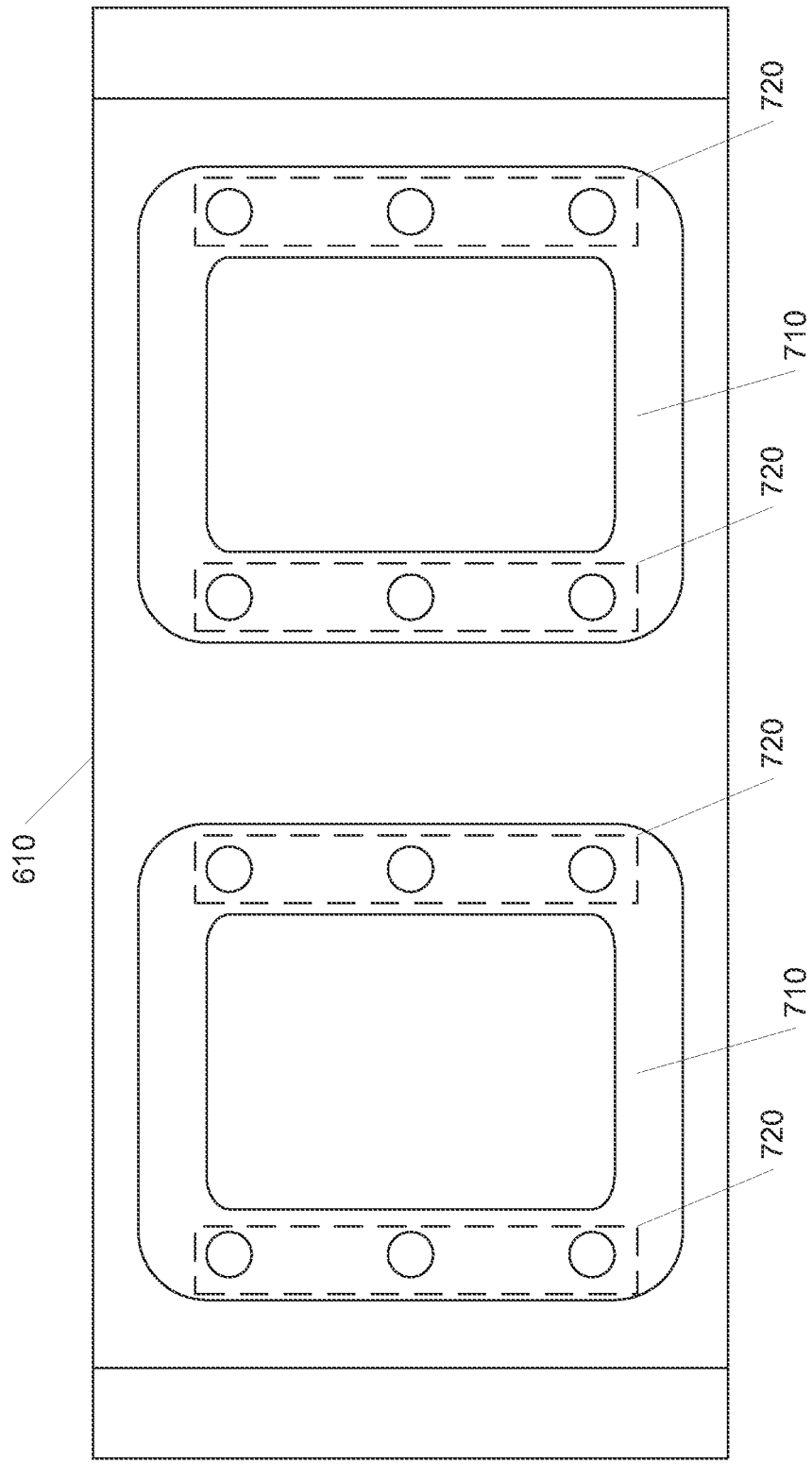
FIG. 7 is a diagram of the bridge plate of FIG. 6 in accordance with a representative embodiment.

Referring to FIG. 7, a diagram of the bridge plate 610 of FIG. 6 in accordance with a representative embodiment is shown. The bridge plate 610 includes heat spreaders 710 for each set of heat pipes. In one implementation, the bridge plate 610 is aluminum and the heat spreader 710 is made of copper alloy. The heat spreader 710 is located inside of the bridge plate 610. The bridge plate 610 also includes holes 720 which are used to attach the heat pipes. The holes 720 go through the heat spreader 710 so that when the heat pipes are attached, there is a direct thermal connection between the heat pipes and the heat spreader 710. The heat spreader 710 increases the thermal transfer efficiency of the bridge plate 610 by directing the thermal flow. In this example, the heat spreaders 710 are doughnut shaped. Alternatively, the heat spreader could run horizontally as well as other configurations.

Figure 8:
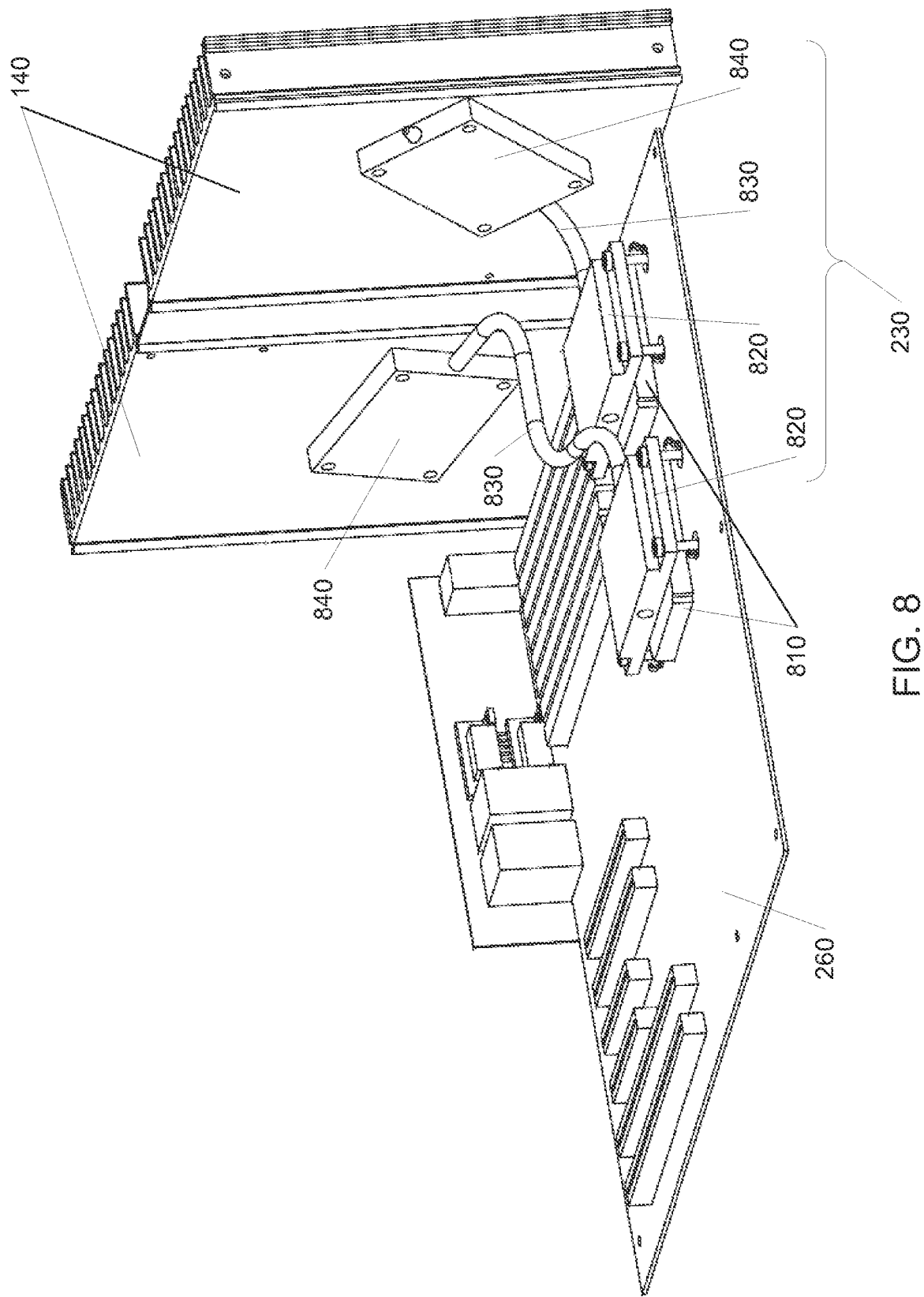
FIG. 8 is a perspective view of the processor heat pipe assembly of FIG. 2 in accordance with a representative embodiment.

Referring to FIG. 8, a perspective view of the processor heat pipe assembly 230 of FIG. 2 in accordance with a representative embodiment is shown. Motherboard 260 includes processors 810. A first thermal mass 820 is attached to each of the processors 810. The first thermal masses 820 are thermally coupled to second thermal masses 840 by heat pipes 830. The second thermal masses 840 are each thermally coupled to a heat sink 140. A thermal compound can be applied between the first thermal masses 820 and the processors; and the second thermal masses 840 and the heat sinks 140.

As the processors produce heat, the first thermal masses 820 draw heat from the processors. The second thermal masses 840 draw heat from the first thermal masses 820 through heat pipes 830. The heat sinks 140 draw heat from the second thermal masses 840. Finally, the heat sinks 140 dissipate the heat into the ambient air. Advantageously, the passive cooling system provides effective cooling to processors without the use of fans or a liquid cooling system.

Figure 25:
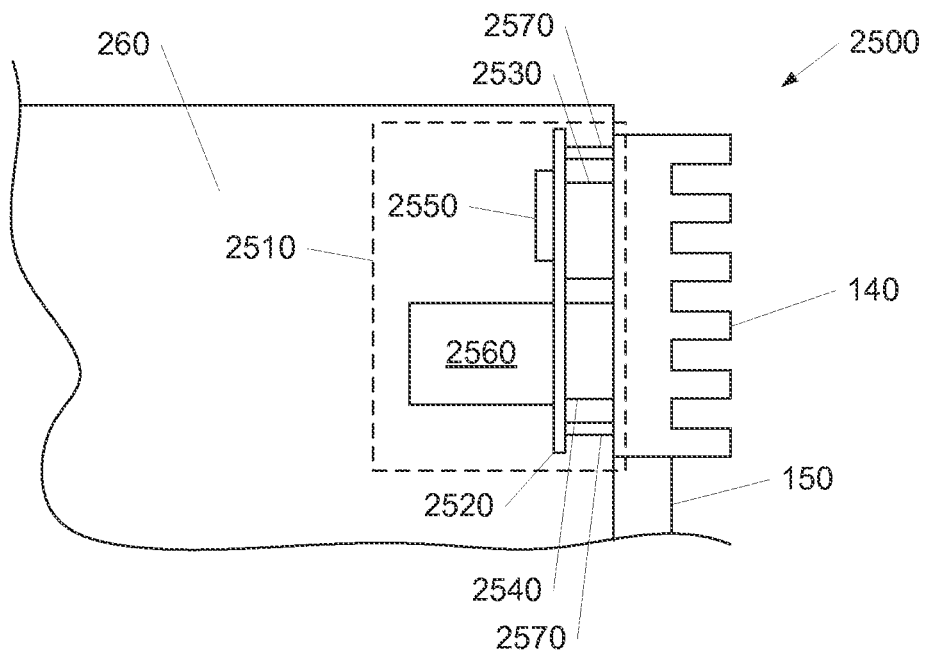
FIG. 25 is a top view of a portion of a passive cooling system in accordance with a representative embodiment.

As noted above, a power supply can also be thermally coupled to a heat sink. Referring to FIG. 25, a top view of a portion of a passive cooling system 2500 in accordance with a representative embodiment is shown. The portion of a passive cooling system 2500 is an illustrative power supply area of a passive cooling system including a heat sink 140, a filler strip 150, and a motherboard 260, as described above.

A power supply 2510 can be thermally coupled to the heat sink 140. The power supply 2510 provides power for the passive cooling system. The power supply 2510 can include a printed circuit board 2520, a first power supply integrated circuit 2530, a second power supply integrated circuit 2540, components 2550, and capacitor 2560. The power supply 2510 can be attached to the heat sink 140 by standoffs 2570. The first power supply integrated circuit 2530 and the second power supply integrated circuit 2540 can be, for example, a power transistor or a power supply module. The first power supply integrated circuit 2530 and the second power supply integrated circuit 2540 can, for example, switch at a high rate in order to convert 120 VAC to one of at least 12 VDC, 5 VDC, 3.3 VDC or any other voltage, thereby generating heat.

In one illustrative embodiment, the first power supply integrated circuit 2530 and the second power supply integrated circuit 2540 are soldered to a first side of the printed circuit board 2520 such that the first power supply integrated circuit 2530 and the second power supply integrated circuit 2540 can be positioned directly against the heat sink 140 thereby thermally coupling the first power supply integrated circuit 2530 and the second power supply integrated circuit 2540 to the heat sink 140. The junction between the power supply integrated circuits (2530, 2540) and the heat sink 140 can include a thermal compound to enhance the thermal characteristics of the thermal coupling. Heat generated by the power supply 2510, in particular, the first power supply integrated circuit 2530 and the second power supply integrated circuit 2540, is drawn to the heat sink 140 and dissipated into the ambient air.

Other parts of the power supply 2510, such as components 2550, and capacitor 2560, can be located on a second side of the printed circuit board 2520. The components 2550 and capacitor 2560 are arranged so that the area of the printed circuit board 2520 can be minimized while providing clearance for the power supply integrated circuits (2530, 2540) on the first side of the printed circuit board 2520. Alternatively, the first power supply integrated circuit 2530, the second power supply integrated circuit 2540, the components 2550, and the capacitor 2560 can be located on one side of the printed circuit board 2520 and arranged so that the power supply integrated circuits (2530, 2540) can contact the heat sink 140. The heat sink 140 can include a raised area to enable contact with the power supply integrated circuits (2530, 2540). Alternatively, any number of power supply integrated circuits or components can be thermally coupled to the heat sink. Advantageously, the power supply can be cooled directly by a heat sink of the passive cooling system.

Figure 26:
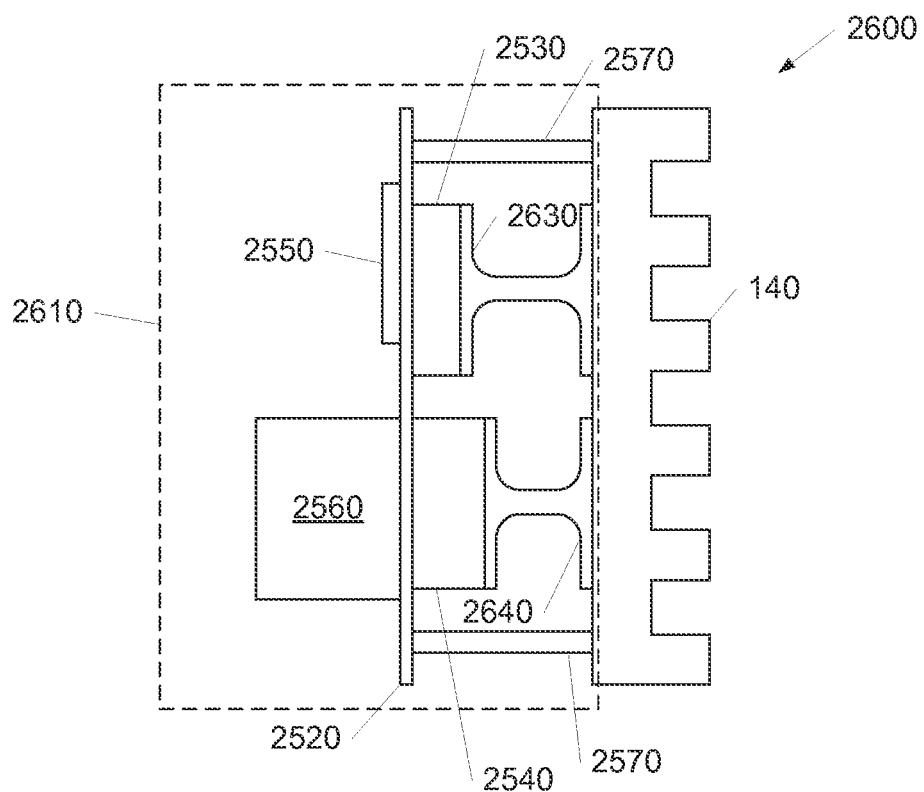
FIG. 26 is a top view of power supply unit in accordance with a representative embodiment.

Referring to FIG. 26, a top view of power supply unit 2600 in accordance with a representative embodiment is shown. The power supply unit 2600 can be integrated into a passive cooling system. The power supply unit 2600 provides power to the passive cooling system.

The power supply unit 2600 includes a power supply 2610 and a heat sink 140. The power supply 2610 can be thermally coupled to the heat sink 140. The power supply 2610 can include a printed circuit board 2520, a first power supply integrated circuit 2530, a second power supply integrated circuit 2540, components 2550, and capacitor 2560. The power supply 2610 can be attached to the heat sink 140 by standoffs 2570. The first power supply integrated circuit 2530 and the second power supply integrated circuit 2540 can be, for example, a power transistor or a power supply module.

In one illustrative embodiment, the first power supply integrated circuit 2530 and the second power supply integrated circuit 2540 are soldered to a first side of the printed circuit board 2520. The first power supply integrated circuit 2530 is coupled to a first heat pipe 2630. The first heat pipe 2630 is coupled to the heat sink 140. Thus, the first power supply integrated circuit 2530 is thermally coupled to the heat sink 140 via the first heat pipe 2630. Heat generated by the first power supply integrated circuit 2530 is drawn to the heat sink 140 through the first heat pipe 2630 and dissipated into the ambient air. The first heat pipe 2630 can be an "I-beam" shape; however, any other shape can be used. The joints between the first power supply integrated circuit 2530, the first heat pipe 2630, and the heat sink 140 can include thermal compound to enhance thermal coupling.

The second power supply integrated circuit 2540 is coupled to a second heat pipe 2640. The second heat pipe 2640 is coupled to the heat sink 140. Thus, the second power supply integrated circuit 2540 is thermally coupled to the heat sink 140 via the second heat pipe 2640. Heat generated by the second power supply integrated circuit 2540 is drawn to the heat sink 140 through the second heat pipe 2640 and dissipated into the ambient air. The second heat pipe 2640 can be an "I-beam" shape; however, any other shape can be used. The joints between the second power supply integrated circuit 2540, the second heat pipe 2640, and the heat sink 140 can include thermal compound to enhance thermal coupling.

The first heat pipe 2630 and the second heat pipe 2640 can be made of copper alloy, aluminum, metal, or any other thermally conductive material. As shown, the first heat pipe 2630 and the second heat pipe 2640 can be different heights in order to accommodate the different heights of the first power supply integrated circuit 2530 and the second power supply integrated circuit 2540. Alternatively, one or more heat pipes can be used to connect the power supply to the heat sink. The power supply can include any number of power supply integrated circuits and other components. Additionally, the heat pipes can have various configurations depending on the particular implementation of the power supply. For example, a heat pipe could span across many components or pierce the printed circuit board to contact the bottom of a component. Advantageously, the heat pipes cool the power supply by drawing heat from the power supply to the heat sink.

Passive Cooling Enclosure System

Figure 9:
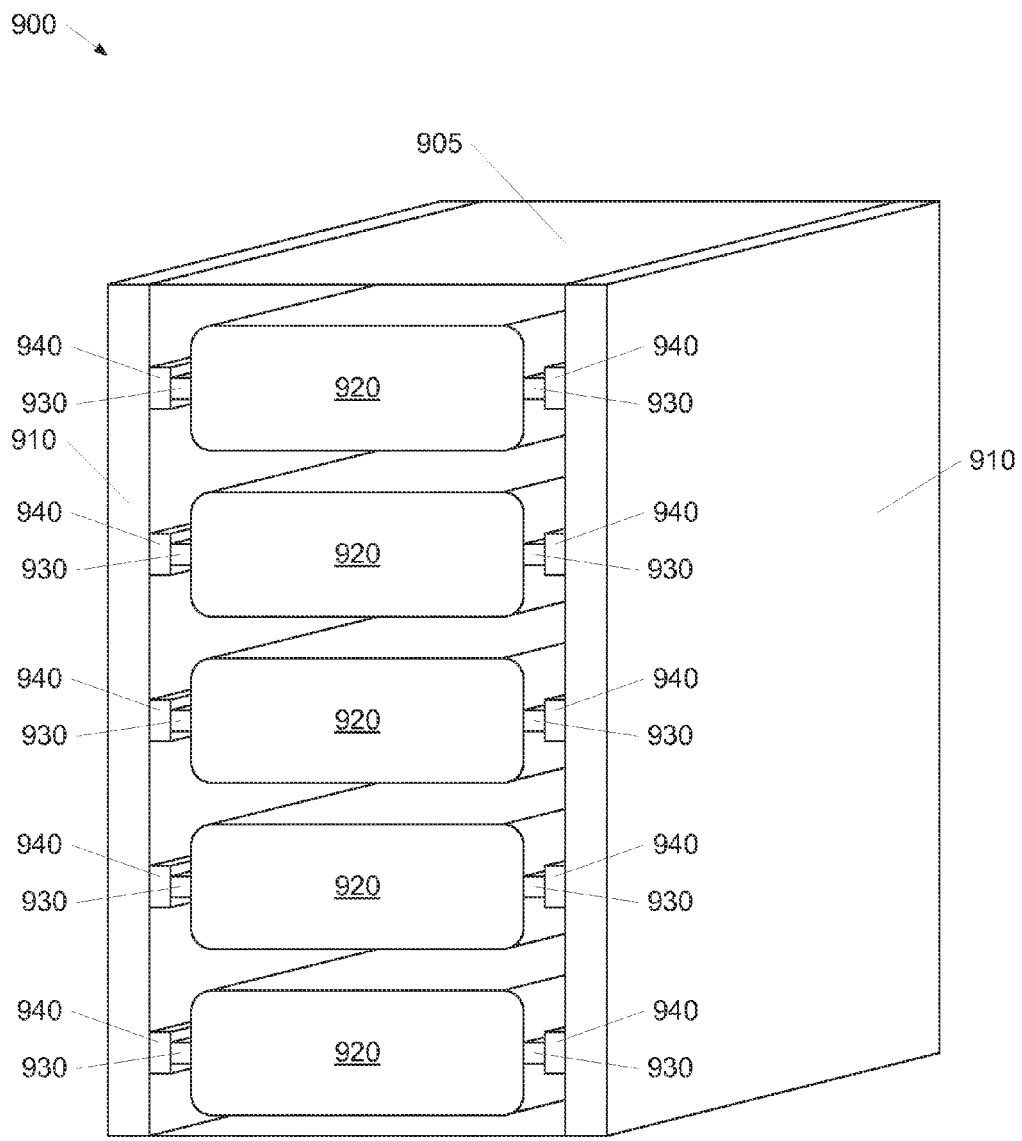
FIG. 9 is a perspective view of a passive cooling enclosure system in accordance with a representative embodiment.

Referring to FIG. 9, a perspective view of a passive cooling enclosure system 900 in accordance with a representative embodiment is shown. In one embodiment, the passive cooling enclosure system 900 is configured as a rack. The passive cooling enclosure system 900 can include a support structure 905, heat sinks 910, cabinets 920, heat pipes 930, and pipe connectors 940. Unlike the passive cooling system 100, the heat sinks of passive cooling enclosure system 900 can be located on the rack enclosure instead of (or in addition to) the individual rack-mount chassis. The passive cooling enclosure system 900 can be a rack for mounting rack-mount chassis. The passive cooling enclosure system 900 can be integrated into, or be part of, a structure such as a standard shipping container, a containerized data center, or a building. For example, the heat sinks 910 can be integrated into the sides of a shipping container.

The support structure 905 can support heat sinks 910 and cabinets 920. The support structure 905 can be the size of a standard rack, for example, for mounting servers. The support structure 905 can be any height, depth, and width. The support structure 905 can include a power supply and a back plane for powering and communicatively coupling the cabinets 920.

The heat sinks 910 can include fins, coolant channels, or any other heat dissipation means. Fins are preferably integrated vertically into the outside of the heat sinks 910. The heat sinks 910 can be made of aluminum, aluminum alloy, or any other thermal conductor. The heat sinks 910 can include heat spreaders as described above (not shown). The heat spreaders can be made of copper alloy, or any other thermal conductor.

The heat sinks 910 can include pipe connectors 940. The pipe connectors 940 thermally couple the heat sinks 910 to heat pipes 930. The pipe connectors 940 can include a clamping mechanism or clamping means to mechanically secure the pipe connectors 940 to the heat pipes 930 thereby promoting a thermal bond between the pipe connectors 940 and the heat pipes 930. In addition, the pipe connectors 940 can mechanically secure the cabinets 920 to the support structure 905. The pipe connectors 940 can be separate from the heat sinks 910 or integrated into the heat sinks 910. Various clamping mechanisms can be employed as described further below. The pipe connectors 940 can be made of aluminum, aluminum alloy, or any other thermal conductor.

The cabinets 920 can be inserted into the support structure 905. The cabinets 920 can be a server, a switch, a router, a storage device, a battery backup, electrical equipment, or any other electronics device. The cabinets 920 can be any height or depth. In particular, the cabinets 920 can include bays, as described above. The bays can be configured in various configurations such as horizontal or vertical. Additionally, the cabinets 920 can include other input devices such as removable media drives, keyboards, displays, mice, or joysticks. Alternatively, the cabinets 920 can be a programmable logic controller chassis, a blade chassis, a VMEbus-type enclosure, a PCI-type enclosure, a CompactPCI-type enclosure, a server, or any other electronic device with modular bays and/or sub-bays. Alternatively, the heat sinks 910 can support cabinets 920.

The cabinets 920 can include heat pipes 930. The heat pipes 930 can be thermally coupled to the internal components of the cabinets 920. For example, the heat pipes 930 can be thermally coupled to processors, disk drives, or other heat generating components of the cabinets 920. On each side associated with a heat sink 910, the heat pipe 930 can be a single heat pipe or multiple, individual heat pipes. Alternatively, the heat pipes 930 can be part of the heat sinks 910 and the pipe connectors 940 can be part of the cabinets 920. Advantageously, heat from each of the cabinets 920 can be drawn out to the heat sinks 910 through heat pipes 930 and pipe connectors 940. Advantageously, each of the cabinets 920 is cooled by thermal conduction thereby eliminating dust build-up on internal components of the cabinets 920.

In one illustrative embodiment, each of the cabinets 920 can be a server with modular bays as described above. In another illustrative embodiment, each of the cabinets 920 can be a sealed rack chassis unit such as a hermetically sealed unit. Advantageously, a sealed rack chassis unit can be easily removed and cleaned. For example, suppose a server farm consisting of passive cooling enclosure systems was located in an area that was exposed to a biohazard such as anthrax or to particulate contamination, floods, or a hurricane. Personnel could easily remove and decontaminate or salvage the sealed rack chassis units. The decontaminated or salvaged sealed rack chassis units could then be safely moved to a different facility thereby preserving the equipment and the data stored on the sealed rack chassis units. In addition, the support structure 905 and heat sinks 910 can be easily decontaminated. In addition, any power modules or other electronics associated with the passive cooling enclosure system 900 can be sealed in a removable cabinet.

In another illustrative embodiment, the passive cooling enclosure system 900 can be integrated into, or be part of, a structure such as a standard shipping container, a containerized data center, or a building. For example, the heat sinks 910 can be integrated into the outside of a shipping container. The fins of heat sinks 910 can be located along the sides (and top and bottom) of the shipping container. Advantageously, heat generated by cabinets 920 can be drawn to heat sinks 910. Advantageously, the heat sinks 910, which are part of the shipping container, can be cooled with ambient air. Advantageously, a portable data center including the passive cooling enclosure system 900 requires minimal maintenance and requires less power to operate than a conventional server farm.

In particular, sealed rack chassis units can be advantageous in many military applications. For example, the sealed design of the cabinets 920 allows the cabinets 920 to be operated in extreme environments such as the desert, sea-side, or the arctic. For example, moisture entering a cabinet in an arctic environment could easily cause condensation to build on electronic components causing a failure. Because the cabinets 920 are sealed, dust, dirt, sand, moisture, and other contaminates cannot get into the cabinets 920. Additionally, the passive cooling enclosure system 900 consumes significantly less power than a typical server rack. Therefore, the passive cooling enclosure system 900 is easily adaptable to many environments where acquiring power is a challenge. Consequently, the cabinets 920 require minimal maintenance, use less power than a typical rack, and are less prone to failure.

Figure 10:
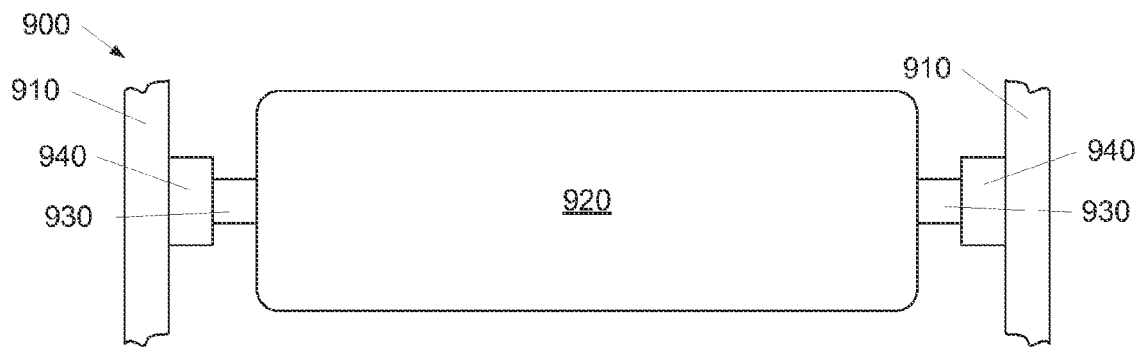
FIG. 10 is a front view of the passive cooling enclosure system of FIG. 9 in accordance with a representative embodiment.

Referring to FIG. 10, a front view of the passive cooling enclosure system 900 of FIG. 9 in accordance with a representative embodiment is shown. The passive cooling enclosure system 900 includes heat sinks 910, cabinets 920, heat pipes 930, and pipe connectors 940 as discussed above.

Figure 11:
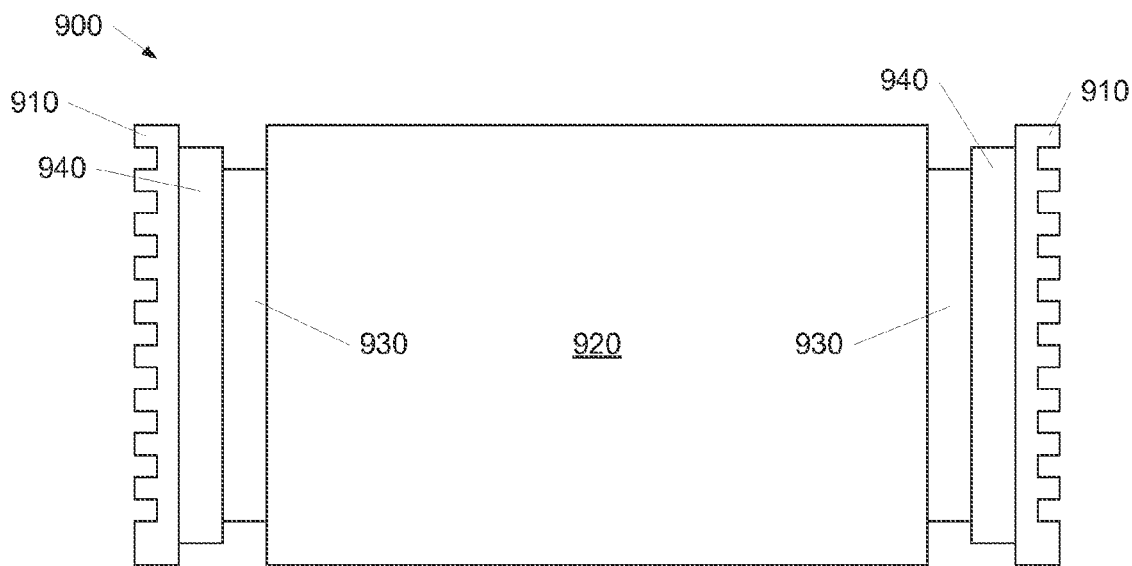
FIG. 11 is a top view of the passive cooling enclosure system of FIG. 9 in accordance with a representative embodiment.

Referring to FIG. 11, a top view of the passive cooling enclosure system 900 of FIG. 9 in accordance with a representative embodiment is shown. The passive cooling enclosure system 900 includes heat sinks 910, cabinets 920, heat pipes 930, and pipe connectors 940 as discussed above.

Figure 12:
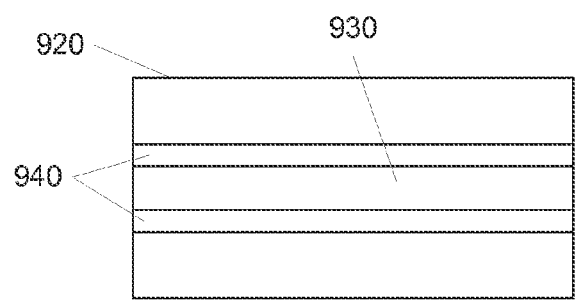
FIG. 12 is a side view of the passive cooling enclosure system of FIG. 9 in accordance with a representative embodiment.

Referring to FIG. 12, a side view of the passive cooling enclosure system 900 of FIG. 9 in accordance with a representative embodiment is shown. The passive cooling enclosure system 900 includes cabinets 920, heat pipes 930, and pipe connectors 940 as discussed above.

Figure 13:
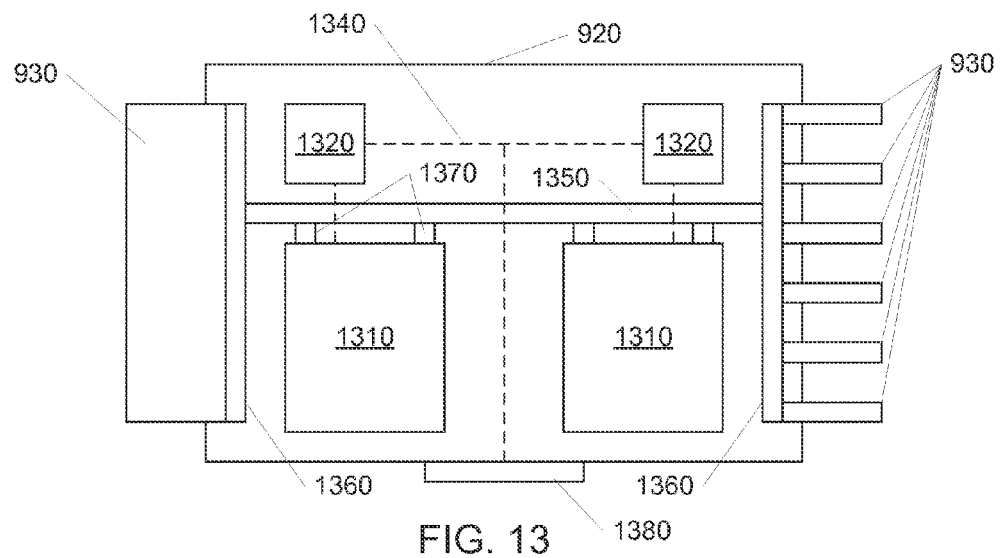
FIG. 13 is a top view of the inside of a cabinet of FIG. 9 in accordance with a representative embodiment.

Referring to FIG. 13, a top view of the inside of a cabinet 920 of FIG. 9 in accordance with a representative embodiment is shown. The cabinet 920 includes heat pipes 930 as described above. The right side of cabinet 920 shows many individual heat pipes and the left side of cabinet 920 shows a single heat pipe.

The heat pipes 930 can be thermally connected to internal heat pipes 1360. The internal heat pipes 1360 are thermally coupled to bridge plate 1350. The bridge plate 1350 can be thermally coupled to device heat pipes 1370. The device heat pipes 1370 can be thermally coupled to devices 1310. Devices 1310 can be, for example, hard drives as discussed above. Processors 1320 can also be thermally coupled to the internal heat pipes 1360 and/or to bridge plate 1350. Thus, heat generated by devices 1310 and processors 1320 can be drawn from the devices 1310 and processors 1320 to the heat pipes 930. Alternatively, where a cabinet includes pipe connectors, heat generated by devices 1310 and processors 1320 can be drawn from the devices 1310 and processors 1320 to the pipe connectors.

The devices 1310 and processors 1320 can be electrically connected by motherboard 1340. Motherboard 1340 can be electrically connected to external devices through port 1380. Port 1380 can be hermetically sealed allowing electrical connections with cabinet 920 without exposing the internal components of the cabinet 920 to contaminants.

Figure 14:
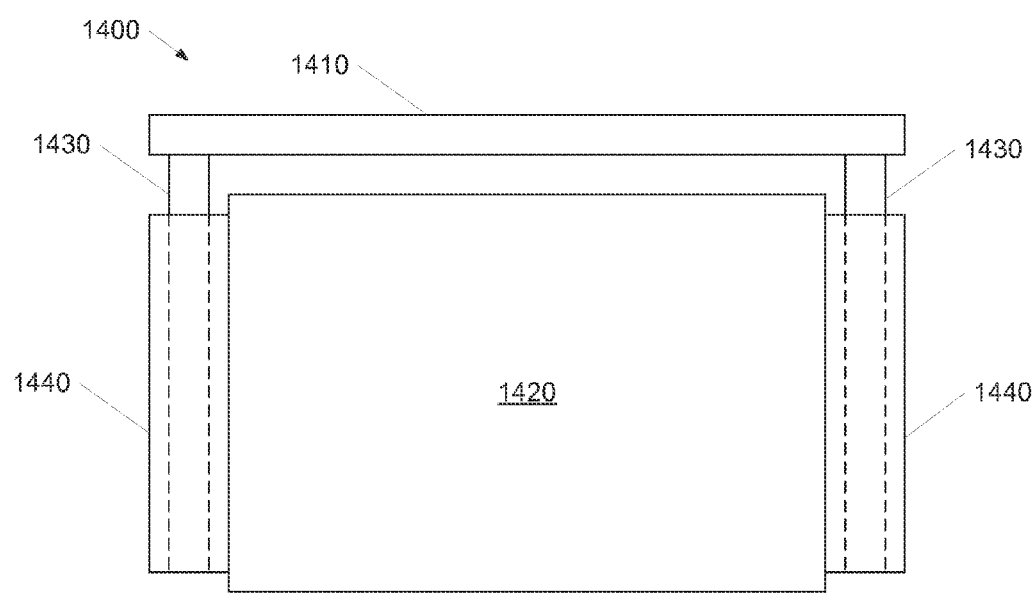
FIG. 14 is a top view of a passive cooling enclosure system with a rear heat sink in accordance with a representative embodiment.

Referring to FIG. 14, a top view of a passive cooling enclosure system with a rear heat sink 1400 in accordance with a representative embodiment is shown. In one embodiment, the passive cooling enclosure system with a rear heat sink 1400 is configured as a rack. The passive cooling enclosure system with a rear heat sink 1400 includes a heat sink 1410, a cabinet 1420, heat pipes 1430, and pipe connectors 1440.

The heat sink 1410 can include fins, coolant channels, or any other heat dissipation means as discussed above. The heat sink 1410 is located toward the rear. In some embodiments, the heat sink 1410 also provides the structure of the rack.

The heat sink 1410 can include heat pipes 1430. The heat pipes 1430 can be thermally coupled to the heat sink 1410. The heat pipes 1430 protrude from the heat sink 1410. In some embodiments, the heat pipes 1430 can be tapered.

The cabinet 1420 can include pipe connectors 1440. The pipe connectors 1440 include recesses that match the heat pipes 1430. When the cabinet 1420 is mounted to the passive cooling enclosure system with a rear heat sink 1400, pipe connectors 1440 slide over heat pipes 1430. The pipe connectors 1440 can include a clamping mechanism or clamping means to mechanically secure the pipe connectors 1440 to the heat pipes 1430 thereby promoting a thermal bond between the pipe connectors 1440 and the heat pipes 1430. In addition, the pipe connectors 1440 can mechanically secure the cabinets 1420 to the heat pipes 1430.

Figure 15:
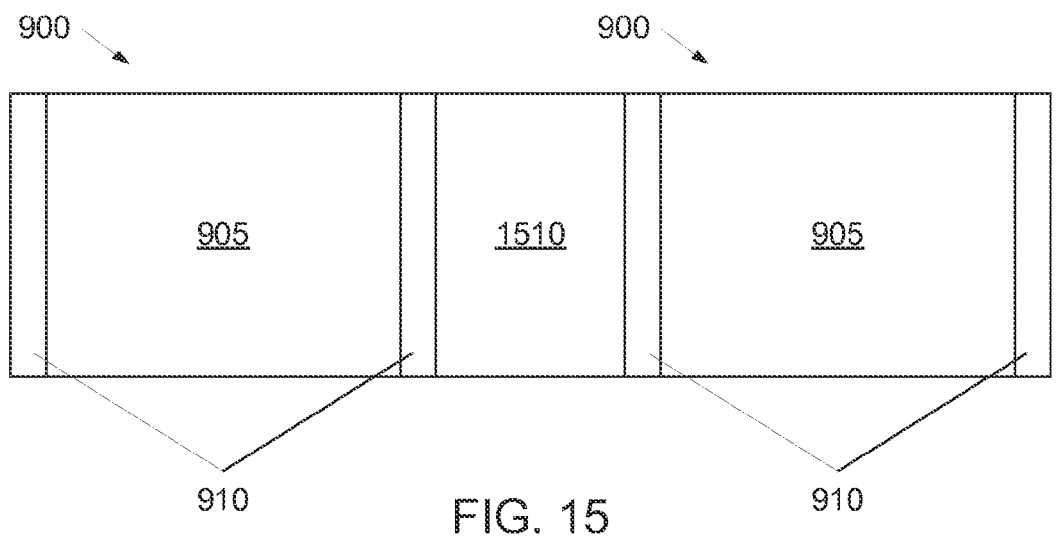
FIG. 15 is a top view of a passive cooling enclosure system configuration in accordance with a representative embodiment.

Passive cooling enclosure systems can be arranged in various configurations. Referring to FIG. 15, a top view of a passive cooling enclosure system configuration in accordance with a representative embodiment is shown. In FIG. 15, two passive cooling enclosure systems 900 are arranged side-by-side. Each passive cooling enclosure system 900 includes a support structure 905 and heat sinks 910 as discussed above.

The two passive cooling enclosure systems 900 are separated by a channel 1510. The channel 1510 is formed in part by two heat sinks 910 from each of the two passive cooling enclosure systems 900. The channel 1510 can act like a duct to contain air. Additionally, the channel 1510 can be integrated into other data center monitoring and/or cooling technologies. In one illustrative embodiment, the channel 1510 can be used to contain cool air. In another illustrative embodiment, the channel 1510 can be used to contain a gas such as, but not limited to, air, humidified air, air conditioned air, nitrogen gas, or any other gas. In another illustrative embodiment, the channel 1510 can be used to contain a liquid such as, but not limited to, glycol, ammonia, water, or any other liquid. The channel 1510 can be adapted to the particular coolant mechanism employed.

Figure 16:
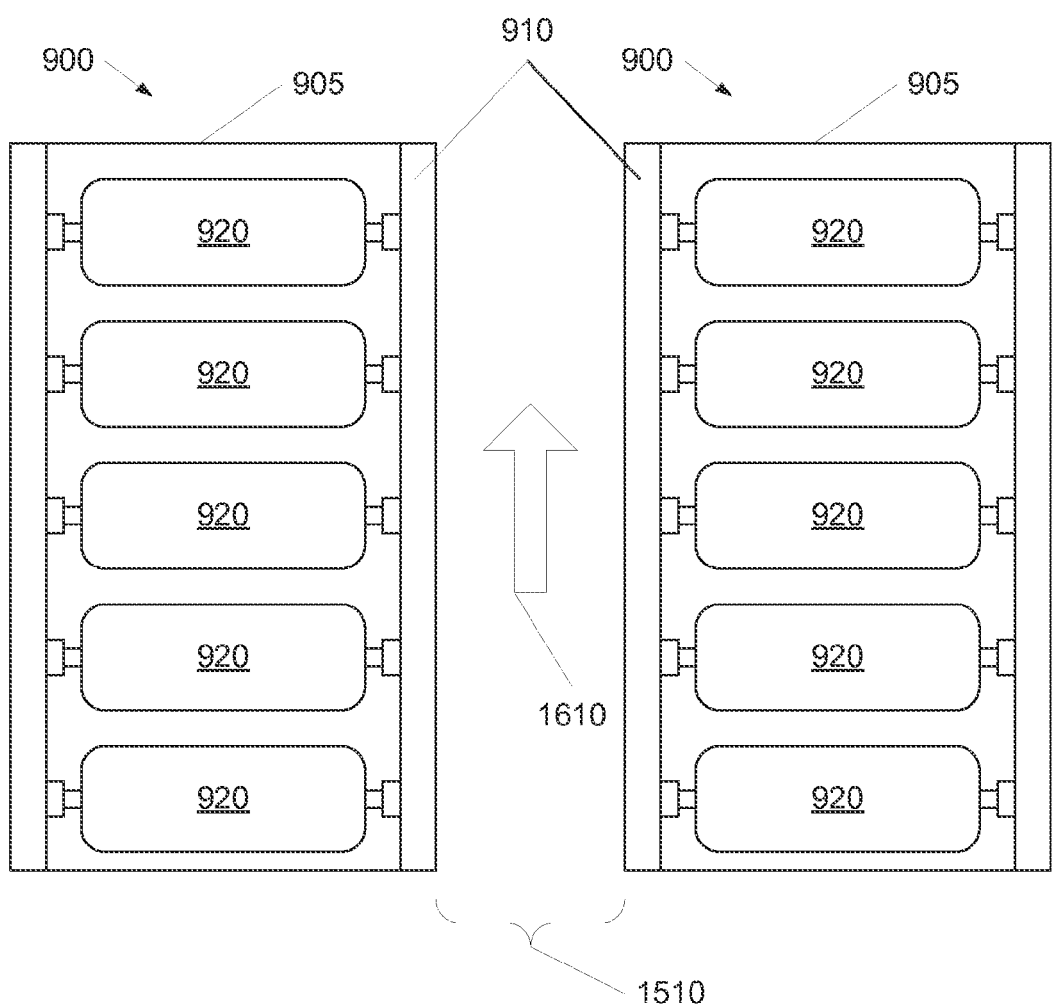
FIG. 16 is a front view of a passive cooling enclosure system configuration of FIG. 15 in accordance with a representative embodiment.

Referring to FIG. 16, a front view of a passive cooling enclosure system configuration of FIG. 15 in accordance with a representative embodiment is shown. The two passive cooling enclosure systems 900 are arranged side-by-side. Each passive cooling enclosure system 900 includes a support structure 905, heat sinks 910, and cabinets 920 as discussed above.

The two passive cooling enclosure systems 900 are separated by a channel 1510. The channel 1510 is formed in part by two heat sinks 910 from each of the two passive cooling enclosure systems 900. The channel 1510 can act like a duct to contain air. In one illustrative embodiment, the channel 1510 can be used to contain a gas. In another illustrative embodiment, the channel 1510 can be used to contain a liquid.

Air can move through the channel 1510 as represented by arrow 1610. The air flows over the two heat sinks 910 from each of the two passive cooling enclosure systems 900 that form the channel 1510 thereby drawing heat from the heat sinks 910.

The channel 1510 can be used to conduct air passively over the heat sinks 910, i.e. by convection. In addition, air can be forced through channel 1510, for instance, by using a fan. In one illustrative embodiment, cool air from outside a facility is drawn into the channel 1510. Advantageously, the cooling air in the channel 1510 cannot reach the cabinets 920 thereby preventing contaminants from entering electronics.

Advantageously, raised floors, hot aisle/cold aisle configurations, and heating ventilation and air conditioning (HVAC) systems are not need to cool the cabinets 920. Advantageously, computing and electronics facilities can be arranged in a space-saving manner by reducing the amount of ductwork needed for cooling server racks.

Figure 17:
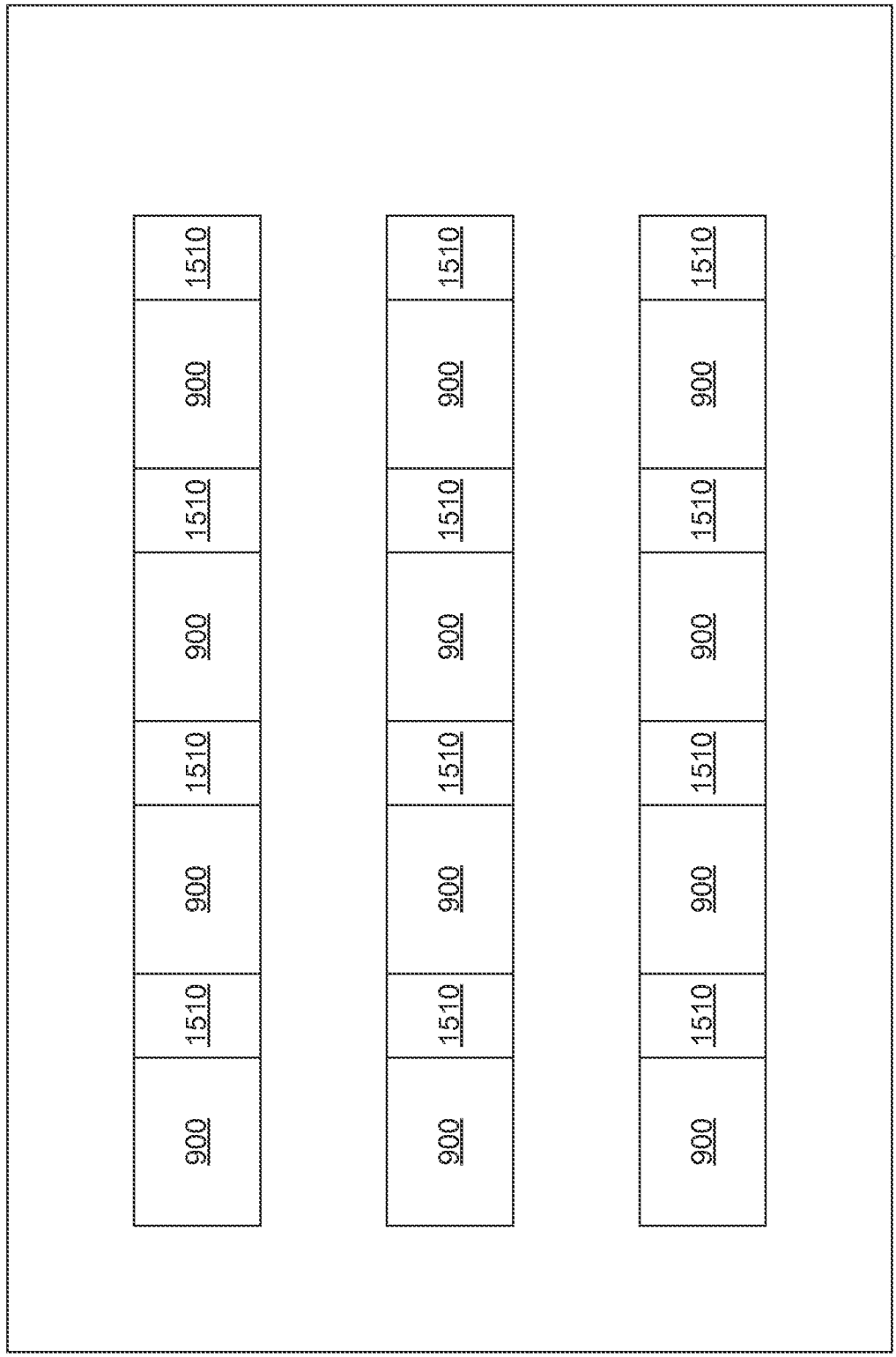
FIG. 17 is a top view of a server room in accordance with a representative embodiment.

Referring to FIG. 17, a top view of a server room 1710 in accordance with a representative embodiment is shown. The server room 1710 can be arranged in various configurations. In one illustrative embodiment, passive cooling enclosure systems 900 are arranged in rows. Every two passive cooling enclosure systems 900 are separated by a channel 1510. The server room 1710 can be a building, a modular freight container, part of a vehicle, or any other enclosure.

Air moving through the channels 1510 can draw heat from heat sinks of the passive cooling enclosure systems 900. The channels 1510 can be connected to a duct system. Thus, the inside of server room 1710 is completed separated from the cooling means. Advantageously, contaminates cannot reach the inside of server room 1710. In other illustrative embodiments, the channels 1510 can be configured to contain a gas or liquid, as described above.

Figure 18:
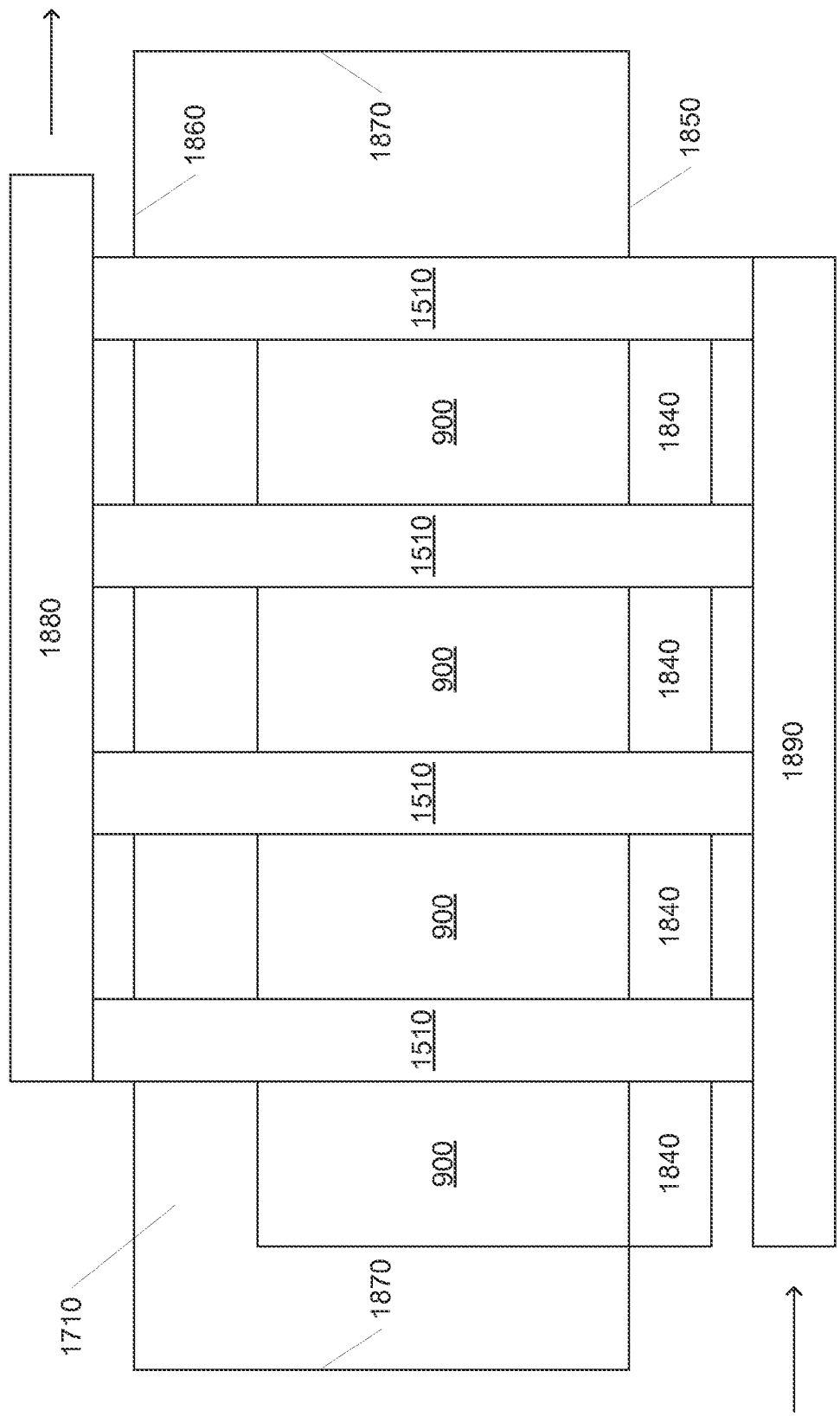
FIG. 18 is a side view of the server room of FIG. 17 in accordance with a representative embodiment.

Referring to FIG. 18, a side view of the server room 1710 of FIG. 17 in accordance with a representative embodiment is shown. The server room 1710 can be arranged in various configurations. In one embodiment, passive cooling enclosure systems 900 are arranged in rows. Every two passive cooling enclosure systems 900 are separated by a channel 1510.

The server room 1710 includes walls 1870, ceiling 1860, and floor 1850. The channels 1510 can extend from the floor 1850 to the ceiling 1860. Cable chases 1840 can run underneath floor 1850. Alternatively, cabling can be run within the server room 1710.

The channels 1510 are connected to an intake duct 1890 below floor 1850 and an exhaust duct 1880 above ceiling 1860. In one illustrative embodiment, cool air from outside a facility is drawn into the intake duct 1890 by convection. The cool air is drawn through channels 1510 and over heat sinks of the passive cooling enclosure systems 900. Thus, the air from the intake duct 1890 is heated. The heated air rises up in the channels 1510 thereby drawing more cool outside air into the intake duct 1890.

The heated air continues into the exhaust duct 1880 by convection. The heated air is expelled to the outside. The convection properties of the channels 1510 and related ductwork can be designed to exhibit specific convective properties. For example, chimneys can be added to the exhaust duct 1880 in order to enhance the convection. In addition, multiple floors can include continuous channels to enhance convection. Various passive and active cooling designs can be implemented as known by those of skill in the art. Advantageously, heat from the cabinets of the passive cooling enclosure systems 900 can be passively removed thereby reducing cooling costs, facilities costs, maintenance costs, and development costs.

Figure 19:
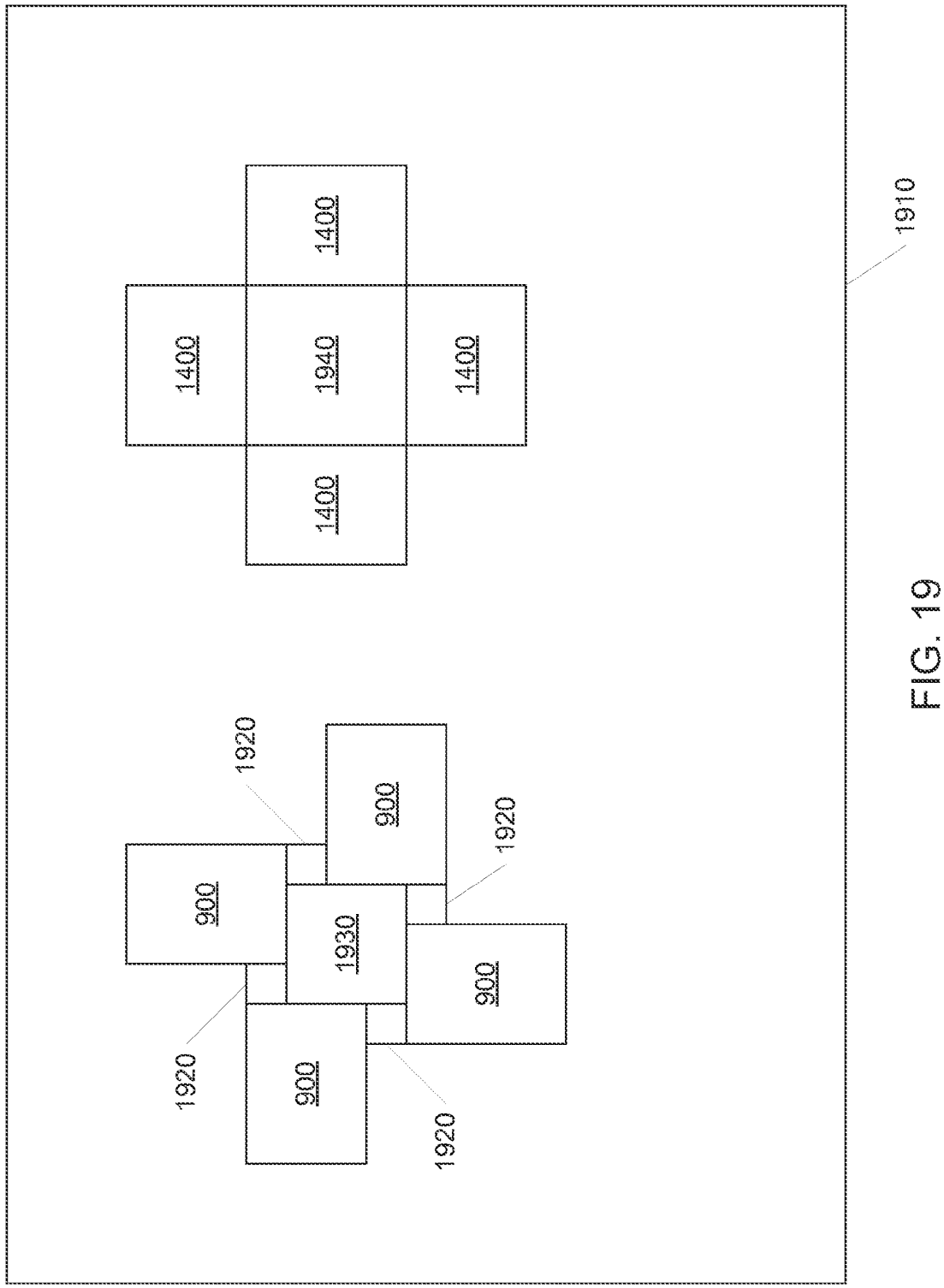
FIG. 19 is a top view of a server room with various alternate configurations in accordance with a representative embodiment.

Referring to FIG. 19, a top view of a server room 1910 with various alternate configurations in accordance with a representative embodiment is shown. The server room 1910 can be arranged in various configurations. In one illustrative embodiment, passive cooling enclosure systems 900 are arranged in pods. Alternatively, more or fewer passive cooling enclosure systems can be arranged in a pod. In addition, the pods can be rotated relative to one another in order to enhance the packing of the pods in a particular space.

Every four passive cooling enclosure systems 900 are separated by a channel 1930 and cabling channels 1920. The four passive cooling enclosure systems 900 and cabling channels 1920 are arranged back-to-back to form channel 1930. In this configuration, the heat sinks of the four passive cooling enclosure systems 900 can be designed so that the heat sinks are only in the channel 1930. The server room 1910 can be a building, a modular freight container, part of a vehicle, or any other enclosure.

Air moving through the channel 1930 can draw heat from heat sinks of the passive cooling enclosure systems 900. The channel 1930 can be connected to a duct system. Thus, the inside of server room 1910 is completed separated from the cooling means. Advantageously, contaminates cannot reach the inside of server room 1910.

In another illustrative embodiment, passive cooling enclosure systems with a rear heat sink 1400 (of FIG. 14) are arranged in an alternative pod arrangement. As discussed above, passive cooling enclosure systems with a rear heat sink 1400 have the heat sink located towards the rear of the rack. Every four cooling enclosure systems with a rear heat sink 1400 are separated by a channel 1940. Alternatively, more or fewer passive cooling enclosure systems can be arranged in a pod. In addition, the pods can be rotated relative to one another in order to enhance the packing of the pods in a particular space.

The four passive cooling enclosure systems with a rear heat sink 1400 are arranged back-to-back to form channel 1940. In this configuration, the heat sinks of the four passive cooling enclosure systems with a rear heat sink 1400 are arranged so that the heat sinks are only in the channel 1940.

Air moving through the channel 1940 can draw heat from heat sinks of the passive cooling enclosure systems with a rear heat sink 1400. The channel 1940 can be connected to a duct system. Thus, the inside of server room 1910 is completed separated from the cooling means. Advantageously, contaminates cannot reach the inside of server room 1910.

Figure 20:
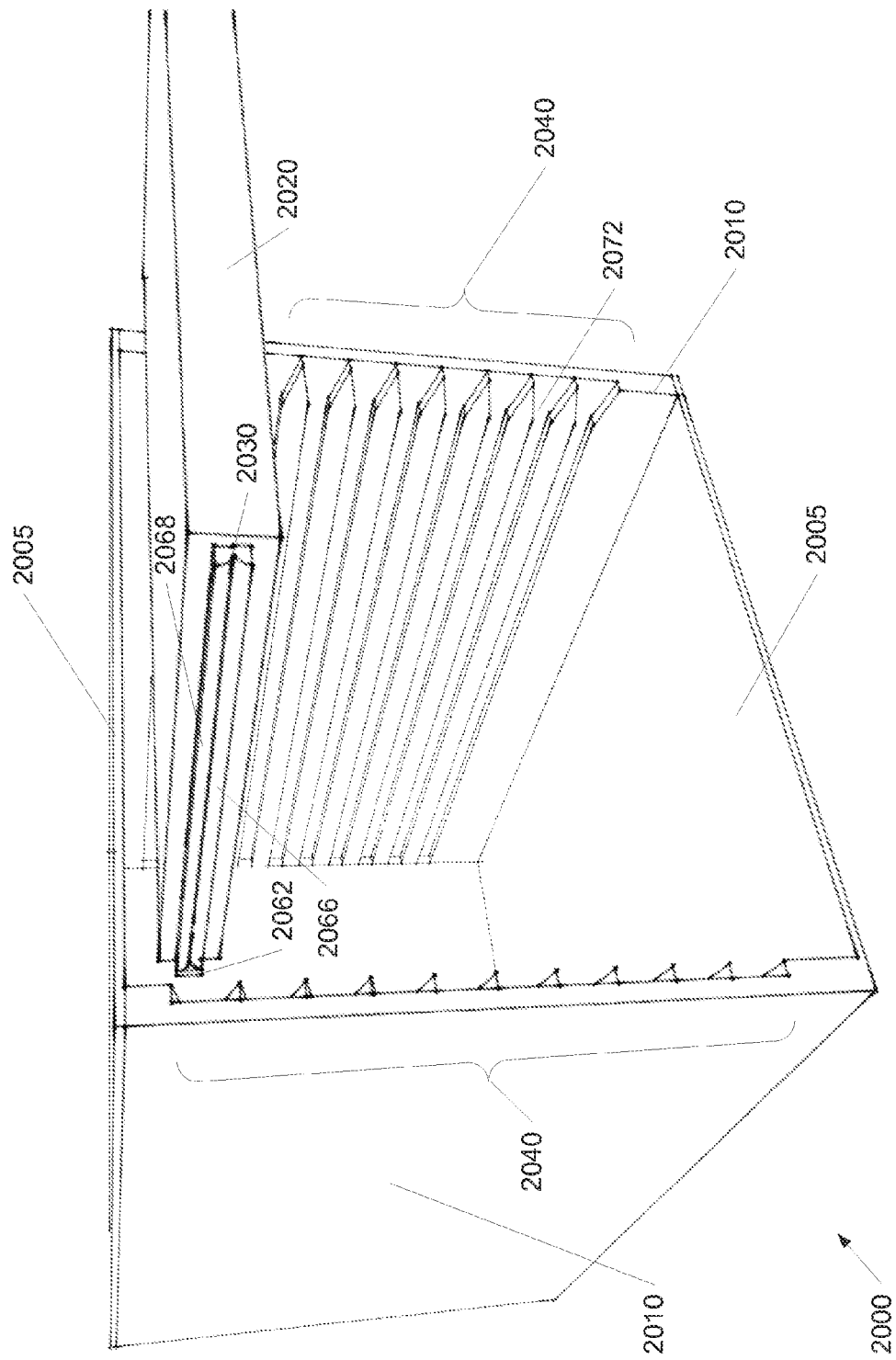
FIG. 20 is a perspective view of a passive cooling enclosure system in accordance with a representative embodiment.

The heat pipes and pipe connectors can be implemented using various thermal connection designs. Referring to FIG. 20, a perspective view of a passive cooling enclosure system 2000 in accordance with a representative embodiment is shown. In FIG. 20, the passive cooling enclosure system 2000 is configured as a standard rack. The passive cooling enclosure system 2000 includes an enclosure structure 2005, heat sinks 2010, a cabinet 2020, heat pipes 2030, and pipe connectors 2040.

The enclosure structure 2005 can support heat sinks 2010. The enclosure structure 2005 can be the size of a standard rack, for example, for mounting servers. The enclosure structure 2005 can include any electronics device. The enclosure structure 2005 can be any height, depth, and width. The enclosure structure 2005 can include a power supply and a back plane for powering and communicatively coupling the cabinet 2020.

The heat sinks 2010 can include fins, coolant channels, or any other heat dissipation means (not shown). The heat sinks 2010 can be made of aluminum, aluminum alloy, or any other thermal conductor. The heat sinks 2010 can include heat spreaders as described above (not shown). The heat spreaders can be made of copper alloy.

The heat sinks 2010 can include pipe connectors 2040. The pipe connectors 2040 thermally couple the heat sinks 2010 to heat pipes 2030. The pipe connectors 2040 can mechanically secure the cabinet 2020 to the passive cooling enclosure system 2000. The pipe connectors 2040 can be integrated into the heat sinks 2010. The pipe connectors 2040 can include slots 2072. The slots 2072 can have a wide taper at the front to allow easy cabinet mounting. The slots 2072 can run along the depth of the heat sinks 2010. The slots 2072 can slightly taper from front to back.

The cabinet 2020 can be inserted into the enclosure structure 2005. The cabinet 2020 can be a server, a switch, a router, a storage device, a battery backup, electrical equipment, or any other electronics device. The cabinet 2020 can be any height or depth. In particular, the cabinet 2020 can include bays, as described above. The bays can be configured in various configurations such as horizontal or vertical.

The cabinet 2020 can include heat pipes 2030. The heat pipes 2030 can be thermally coupled to the internal components of the cabinet 2020. For example, the heat pipes 2030 can be thermally coupled to processors, disk drives, or other heat generating components of the cabinet 2020. In FIG. 20, the heat pipes 2030 run along both sides of the cabinet 2020.

The heat pipes 2030 thermally engage the slots 2072 as the cabinet 2020 is inserted into the passive cooling enclosure system 2000. Thermal compound can be used to enhance the thermal coupling between the heat pipes 2030 and the pipe connectors 2040. The heat pipes 2030 can include a starting block 2062, a first compression rail 2066, and a second compression rail 2066. The starting block 2062 guides the heat pipes 2030 as they are inserted into slots 2072. The starting block 2062 protects the edges of the first compression rail 2066 and the second compression rail 2066. The starting block 2062 is made of a durable material such as aluminum, aluminum alloy, or any other metal. Together, the first compression rail 2066 and the second compression rail 2066 taper to a slightly larger width than the slots 2072, i.e. at the starting block 2062 the width of the first compression rail 2066 and the second compression rail 2066 is about that of the starting block 2062, but, at the opposite end, the first compression rail 2066 and the second compression rail 2066 are slightly wider than the front opening of slots 2072.

The first compression rail 2066 and the second compression rail 2066 can flex to match the slots 2072 thereby engaging the slots 2072 both mechanically and thermally. The first compression rail 2066 and the second compression rail 2066 can have filleting or other relieving that enhances flexing. The first compression rail 2066 and the second compression rail 2066 can be made of any flexible, thermally conductive material such as aluminum, aluminum alloy, or any other metal.

Thus, when the cabinet 2020 is inserted into a set of slots 2072, the starting block 2062 guides the first compression rail 2066 and the second compression rail 2066 into the slots 2072. As the cabinet 2020 is pushed further into the passive cooling enclosure system 2000, the first compression rail 2066 and the second compression rail 2066 press against the sides of the slots 2072 thereby creating a thermal coupling between the heat pipes 2030 and the pipe connectors 2040.

Figure 21:
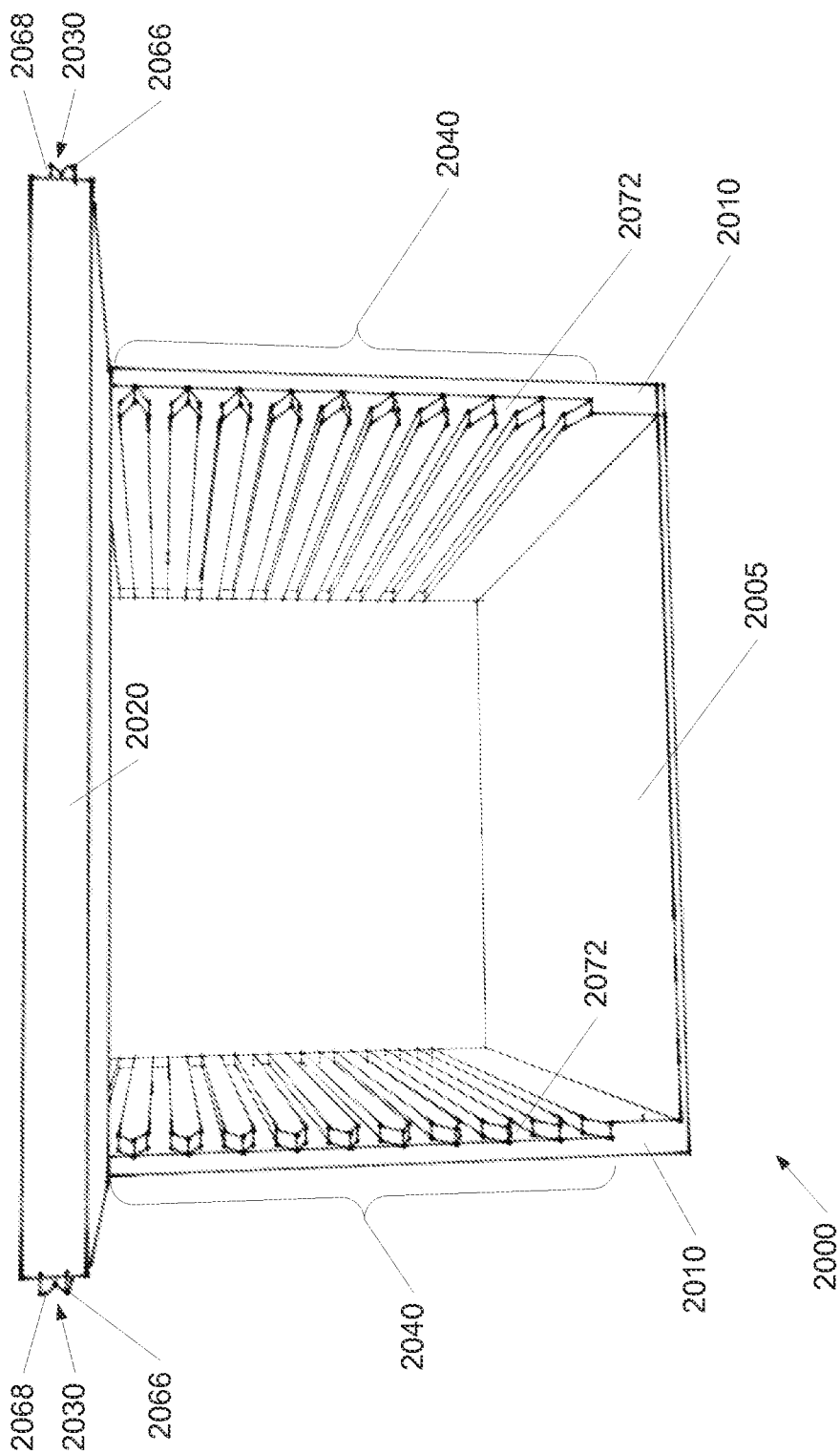
FIG. 21 is a front perspective view of a passive cooling enclosure system of FIG. 20 in accordance with a representative embodiment.

Referring to FIG. 21, a front perspective view of a passive cooling enclosure system 2000 of FIG. 20 in accordance with a representative embodiment is shown. The passive cooling enclosure system 2000 includes an enclosure structure 2005, heat sinks 2010, a cabinet 2020, heat pipes 2030, and pipe connectors 2040. The pipe connectors 2040 can include slots 2072. The heat pipes 2030 can include a first compression rail 2066, and a second compression rail 2066. FIG. 21 shows both heat pipes 2030 of cabinet 2020 engaging slots 2072 of pipe connectors 2040.

Referring to FIG. 22, a top view of a thermal joint 2200 in accordance with a representative embodiment is shown. In one illustrative embodiment, the thermal joint 2200 can be a thermal and mechanical coupling between a heat pipe 2230 and a pipe connector 2240. The heat pipe 2230 is associated with a cabinet 2220. The pipe connector 2240 is associated with a heat sink 2210.

The pipe connector 2240 includes a heat pipe conduit 2245. The pipe connector 2240 is docked on a heat pipe protrusion 2235 that matches heat pipe conduit 2245. The pipe connector 2240 can have one or a plurality of heat pipe conduits 2245. A heat pipe protrusion can be disposed on either side of the cabinet 2220. The heat pipe conduit 2245 can be 1.5 inches or smaller in diameter depending on the application; however, larger conduits are also possible. For example, the heat pipe conduit 2245 can range from 1.5 inches to 0.25 inches in diameter. Additionally, the heat pipe conduits at various locations in a passive cooling enclosure system can each be a different size. For example, a heat conduit/heat pipe for a power supply cabinet can be larger than a heat conduit/heat pipe for a server cabinet. The heat pipe conduit 2245 includes a clamping slot which can be used to change the size of the heat pipe conduit 2245. The heat pipe conduit 2245 can have various profiles such as those depicted in FIGS. 5A-5F. When the cabinet 2220 is inserted in the passive cooling enclosure system, the heat pipe protrusion 2235 engages heat pipe conduit 2245. Alternatively, the heat pipe protrusion 2235 and the heat pipe conduit 2245 can be tapered from back to front.

Referring to FIG. 23, a side view of a thermal joint 2200 of FIG. 22 in accordance with a representative embodiment is shown. The thermal joint 2200 can be a thermal and mechanical coupling between the heat pipe 2230 and the pipe connector 2240. The heat pipe 2230 is associated with cabinet 2220. The pipe connector 2240 is associated with heat sink 2210.

The pipe connector 2240 includes heat pipe conduit 2245. The pipe connector 2240 is docked on heat pipe protrusion 2235 that matches heat pipe conduit 2245. In FIG. 23, the heat pipe protrusion 2235 and the heat pipe conduit 2245 have a circular profile. Alternatively, other various profiles can be used such as in FIGS. 5A-5F.

The pipe connector 2240 can also include a clamping slot 2347. The clamping slot 2347 can be used in conjunction with a clamping mechanism. For example, when a clamping lever of a clamping mechanism is pressed in, the clamping mechanism could close the clamping slot 2347 thereby tightening the heat pipe conduit 2245. The clamping action creates a better thermal coupling between the pipe connector 2240 and the heat pipe 2230. Additionally, the clamping action fastens the cabinet 2220 to the heat pipe 2230 so that the cabinet 2220 cannot move and so that the cabinet 2220 maintains thermal continuity with heat sink 2210. Thus, the cabinet 2220 can be quickly removed and replaced. Alternatively, many other clamping and/or attachment mechanisms are possible.

Referring to FIG. 24, a top view of a protected heat pipe 2400 in accordance with a representative embodiment is shown. In one illustrative embodiment, the heat pipe 2430 is associated with a heat sink 2410. A matching pipe connector (not shown) is associated with a cabinet (not shown). Alternatively, the heat pipe is associated with a cabinet and the pipe connector is associated with the heat sink.

The heat pipe 2430 is thermally coupled to the heat sink 2410. The heat pipe 2430 includes a heat pipe protrusion 2435. The heat pipe protrusion 2435 can have various profiles such as in FIGS. 5A-5F. A protective block 2485 slides over the heat pipe protrusion 2435. The protective block 2485 is spring-loaded by spring 2480. The protective block 2485 prevents the heat pipe protrusion 2435 from getting bent or otherwise damaged.

When a matching pipe connector is slid over the heat pipe protrusion 2435 the protective block 2485 retracts. Eventually, notches 2490 are exposed. The pipe connector can engage the notches 2490 to secure the pipe connector to the heat pipe protrusion 2435. Alternatively, a heat pipe with protective block can be associated with a cabinet.

The foregoing description of the representative embodiments have been presented for purposes of illustration and of description. It is not intended to be exhaustive or to limit the invention to the precise form disclosed, and modifications and variations are possible in light of the above teachings or may be acquired from practice of the invention. For example, the described representative embodiments focused on a representative implementation of a horizontal drive configuration on a rack-mount server. The present invention, however, is not limited to a representative implementation as described and depicted. Those skilled in the art will recognize that the device and methods of the present invention may be practiced using various combinations of components. Additionally, the device and method may be adapted for different electronics systems that need to be cooled. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. An apparatus for cooling electronics, the apparatus comprising:
a modular support structure including:
a first heat sink configured to thermally couple to a cabinet, wherein the first heat sink comprises a first slot that tapers from front to back in terms of a mounting direction of the cabinet such that the first slot is wider at the front than at the back, and wherein the cabinet comprises a first heat pipe configured to thermally engage the first heat sink via the first slot; and
a second heat sink configured to thermally couple to the cabinet, wherein the second heat sink comprises a second slot that tapers from front to back in terms of the mounting direction of the cabinet such that the second slot is wider at the front than at the back, and wherein the cabinet comprises a second heat pipe configured to thermally engage the second heat sink via the second slot;
wherein the first heat sink and the second heat sink are external to the cabinet; and
wherein, when the cabinet is thermally coupled to the first heat sink and the second heat sink, the first heat sink and the second heat sink are configured to passively draw heat from the cabinet.

2. The apparatus of claim 1, wherein the first heat sink and the second heat sink do not include an active fluid cooling element.

3. The apparatus of claim 1, wherein the cabinet comprises at least one electronic device that generates heat.

4. The apparatus of claim 1, wherein the modular support structure is positioned beside a second modular support structure such that a channel is formed between the modular support structure and the second modular support structure, and wherein the channel is configured to receive and direct cooling air over the first heat sink of the modular support structure and a third heat sink of the second modular support structure, wherein the first heat sink comprises at least a portion of a wall of the modular support structure, and wherein the third heat sink comprises at least a portion of a wall of the second modular support.

5. The apparatus of claim 1, further comprising the cabinet.

6. The apparatus of claim 5, wherein the cabinet comprises a sealed cabinet.

7. The apparatus of claim 5, wherein the cabinet is configured to removably couple to the first heat sink and the second heat sink.

8. The apparatus of claim 1, wherein the first heat sink is not thermally coupled to the at least one cabinet using a liquid or a gas.

9. The apparatus of claim 1, wherein the first heat sink and the second heat sink are each located in at least one wall of the modular support structure.

10. The apparatus of claim 1, wherein the modular support structure comprises a plurality of slots, and wherein the plurality of slots are configured to allow a plurality of cabinets to each linearly slide along respective slots of the plurality of slots, and wherein the plurality of slots are configured to receive respective heat pipes extending from an external surface of the respective cabinet.

11. The apparatus of claim 1, wherein the modular support structure encloses the cabinet.

12. The apparatus of claim 11, wherein the modular support structure comprises at least four sides, wherein a first side of the at least four sides comprises the first heat sink, and wherein a second side of the at least four sides opposite the first side comprises the second heat sink.

13. The apparatus of claim 1, wherein the first heat sink and the second heat sink are further configured to passively dissipate heat from the cabinet to a space outside of the modular support structure.

14. A method for passively cooling electronics comprising:
passively drawing heat from a cabinet through:
a first solid thermal joint to a first heat sink located in a modular support structure external to the cabinet, wherein the first heat sink comprises a first slot that tapers from a first end of the modular support structure toward a second end of the modular support structure such that the first slot is wider at the first end of the modular support structure than at the second end of the modular support structure, and wherein the cabinet comprises a first heat pipe configured to thermally engage the first heat sink via the first slot; and
a second solid thermal joint to a second heat sink located in the modular support structure external to the cabinet, wherein the second heat sink comprises a second slot that tapers from the first end of the modular support structure toward the second end of the modular support structure such that the second slot is wider at the first end of the modular support structure than at the second end of the modular support structure, and wherein the cabinet comprises a second heat pipe configured to thermally engage the second heat sink via the second slot;
wherein the cabinet is located between the first heat sink and the second heat sink.

15. The apparatus of claim 5, wherein the first heat pipe and the second heat pipe are each configured to thermally couple to an internal component of the cabinet.

16. The apparatus of claim 5, wherein the first heat pipe includes a first compression rail and a second compression rail, wherein a space is formed between the first compression rail and the second compression rail, and wherein the space tapers from front to back in terms of the mounting direction of the cabinet to engage the first slot between the first compression rail and the second compression rail.

17. The apparatus of claim 16, wherein the first compression rail and the second compression rail are made of a flexible and thermal conductive material.

18. The apparatus of claim 16, wherein the first heat pipe further includes a starting block disposed at an edge of the first heat pipe.

19. The method of claim 14, wherein the first heat pipe includes a first compression rail and a second compression rail, wherein a space is formed between the first compression rail and the second compression rail, and wherein the space tapers from front to back in terms of the mounting direction of the cabinet to engage the first slot between the first compression rail and the second compression rail.

20. The method of claim 14, further comprising:
- forming a channel between the modular support structure and a second modular structure, wherein the modular support structure is positioned beside the second modular support structure;
- receiving and directing cooling air through the channel over the first heat sink of the modular support structure and a third heat sink of the second modular support structure, wherein the first heat sink comprises at least a portion of a wall of the modular support structure, and wherein the third heat sink comprises at least a portion of a wall of the second modular support.

\* \* \* \* \*